United States Patent
Sabde et al.

(10) Patent No.: US 9,653,175 B2
(45) Date of Patent: May 16, 2017

(54) DETERMINATION OF WORD LINE TO WORD LINE SHORTS BETWEEN ADJACENT BLOCKS

(71) Applicant: SANDISK TECHNOLOGIES LLC, Plano, TX (US)

(72) Inventors: Jagdish Sabde, Fremont, CA (US); Sagar Magia, Milpitas, CA (US); Khanh Nguyen, Fremont, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/283,645

(22) Filed: Oct. 3, 2016

(65) Prior Publication Data
US 2017/0025182 A1    Jan. 26, 2017

Related U.S. Application Data

(62) Division of application No. 14/328,070, filed on Jul. 10, 2014, now Pat. No. 9,514,835.

(51) Int. Cl.
*G11C 16/34* (2006.01)
*G11C 29/02* (2006.01)
(Continued)

(52) U.S. Cl.
CPC ...... *G11C 16/3422* (2013.01); *G11C 16/0466* (2013.01); *G11C 16/0483* (2013.01);
(Continued)

(58) Field of Classification Search
CPC .................................................. G11C 16/3422
(Continued)

(56) References Cited

U.S. PATENT DOCUMENTS 5,070,032 A    12/1991   Yuan et al.
5,095,344 A    3/1992    Harari
(Continued)

FOREIGN PATENT DOCUMENTS

CN    101377960 A    3/2009
EP    2261806 A1     12/2010
(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
(Continued)

*Primary Examiner* — Hoai V Ho
*Assistant Examiner* — Muna A Techane
(74) *Attorney, Agent, or Firm* — Vierra Magen Marcus LLP

(57) ABSTRACT

A number of techniques for determining defects in non-volatile memory arrays are presented, which are particularly applicable to 3D NAND memory, such as that of the BiCS type. Word line to word shorts within a memory block are determined by application of an AC stress mode, followed by a defect detection operation. An inter-block stress and detection operation can be used determine word line to word line leaks between different blocks. Select gate leak line leakage, both the word lines and other select lines, is consider, as are shorts from word lines and select lines to local source lines. In addition to word line and select line defects, techniques for determining shorts between bit lines and low voltage circuitry, as in the sense amplifiers, are presented.

16 Claims, 29 Drawing Sheets

(51) Int. Cl.
*G11C 29/06* (2006.01)
*H01L 27/1157* (2017.01)
*H01L 27/11582* (2017.01)
*G11C 16/04* (2006.01)
*G11C 16/16* (2006.01)
*G11C 29/12* (2006.01)

(52) U.S. Cl.
CPC .............. *G11C 16/16* (2013.01); *G11C 29/025* (2013.01); *G11C 29/06* (2013.01); *H01L 27/1157* (2013.01); *H01L 27/11582* (2013.01); *G11C 2029/1202* (2013.01)

(58) Field of Classification Search
USPC .................................................... 365/185.02
See application file for complete search history.

(56) References Cited

U.S. PATENT DOCUMENTS

| | | | |
|---|---|---|---|
| 5,335,198 | A | 8/1994 | Van Buskirk et al. |
| 5,570,315 | A | 10/1996 | Tanaka et al. |
| 5,602,789 | A | 2/1997 | Endoh et al. |
| 5,661,053 | A | 8/1997 | Yuan |
| 5,673,222 | A | 9/1997 | Fukumoto et al. |
| 5,768,192 | A | 6/1998 | Eitan |
| 5,822,256 | A | 10/1998 | Bauer et al. |
| 5,903,495 | A | 5/1999 | Takeuchi et al. |
| 6,011,725 | A | 1/2000 | Eitan |
| 6,046,935 | A | 4/2000 | Takeuchi et al. |
| 6,185,709 | B1 | 2/2001 | Dreibelbis et al. |
| 6,219,286 | B1 | 4/2001 | Fuchigami et al. |
| 6,222,762 | B1 | 4/2001 | Guterman et al. |
| 6,285,597 | B2 | 9/2001 | Kawahara et al. |
| 6,370,075 | B1 | 4/2002 | Haeberli et al. |
| 6,556,465 | B2 | 4/2003 | Haeberli et al. |
| 6,560,143 | B2 | 5/2003 | Conley et al. |
| 6,760,262 | B2 | 7/2004 | Haeberli et al. |
| 6,922,096 | B2 | 7/2005 | Cernea |
| 7,012,835 | B2 | 3/2006 | Gonzalez et al. |
| 7,030,683 | B2 | 4/2006 | Pan et al. |
| 7,135,910 | B2 | 11/2006 | Cernea |
| 7,158,421 | B2 | 1/2007 | Cernea et al. |
| 7,206,230 | B2 | 4/2007 | Li et al. |
| 7,243,275 | B2 | 7/2007 | Gongwer et al. |
| 7,304,893 | B1 | 12/2007 | Hemink |
| 7,345,928 | B2 | 3/2008 | Li |
| 7,368,979 | B2 | 5/2008 | Govindu et al. |
| 7,440,319 | B2 | 10/2008 | Li et al. |
| 7,554,311 | B2 | 6/2009 | Pan |
| 7,616,484 | B2 | 11/2009 | Auclair et al. |
| 7,616,499 | B2 | 11/2009 | Wan et al. |
| 7,683,700 | B2 | 3/2010 | Huynh et al. |
| 7,716,538 | B2 | 5/2010 | Gonzalez et al. |
| 7,795,952 | B2 | 9/2010 | Lui et al. |
| 7,864,588 | B2 | 1/2011 | Betser et al. |
| 7,969,235 | B2 | 6/2011 | Pan |
| 7,973,592 | B2 | 7/2011 | Pan |
| 8,027,195 | B2 | 9/2011 | Li et al. |
| 8,040,744 | B2 | 10/2011 | Gorobets et al. |
| 8,054,680 | B2 | 11/2011 | Matsuzaki et al. |
| 8,102,705 | B2 | 1/2012 | Lui et al. |
| 8,726,104 | B2 | 5/2014 | Sharon |
| 8,750,042 | B2 | 6/2014 | Sharon |
| 2001/0004326 | A1 | 6/2001 | Terasaki |
| 2002/0007386 | A1 | 1/2002 | Martin et al. |
| 2002/0024861 | A1* | 2/2002 | Chevallier ............. G11C 29/50 365/201 |
| 2002/0028541 | A1 | 3/2002 | Lee |
| 2003/0042926 | A1 | 3/2003 | Rost |
| 2003/0117851 | A1 | 6/2003 | Lee et al. |
| 2003/0147278 | A1 | 8/2003 | Tanaka et al. |
| 2003/0217323 | A1 | 11/2003 | Guterman et al. |
| 2004/0022092 | A1 | 2/2004 | Dvir et al. |
| 2005/0024939 | A1 | 2/2005 | Chen et al. |
| 2005/0219896 | A1 | 10/2005 | Chen et al. |
| 2006/0090112 | A1 | 4/2006 | Cochran et al. |
| 2006/0221714 | A1 | 10/2006 | Li et al. |
| 2006/0227602 | A1 | 10/2006 | Honma et al. |
| 2006/0239111 | A1 | 10/2006 | Shingo |
| 2007/0030732 | A1 | 2/2007 | Micheloni et al. |
| 2007/0171719 | A1 | 7/2007 | Hemink |
| 2007/0230261 | A1 | 10/2007 | Haufe et al. |
| 2007/0280000 | A1 | 12/2007 | Fujiu et al. |
| 2007/0296391 | A1 | 12/2007 | Bertin et al. |
| 2008/0062765 | A1 | 3/2008 | Tu et al. |
| 2008/0307342 | A1 | 12/2008 | Furches et al. |
| 2009/0058506 | A1 | 3/2009 | Nandi et al. |
| 2009/0058507 | A1 | 3/2009 | Nandi et al. |
| 2009/0063918 | A1 | 3/2009 | Chen et al. |
| 2009/0100290 | A1 | 4/2009 | Nakanishi et al. |
| 2009/0153230 | A1 | 6/2009 | Pan et al. |
| 2009/0153232 | A1 | 6/2009 | Fort et al. |
| 2009/0225607 | A1 | 9/2009 | Chen et al. |
| 2009/0295434 | A1 | 12/2009 | Umeda et al. |
| 2009/0315616 | A1 | 12/2009 | Nguyen et al. |
| 2009/0316483 | A1 | 12/2009 | Kim et al. |
| 2009/0323417 | A1 | 12/2009 | Takada |
| 2010/0054019 | A1 | 3/2010 | Toda |
| 2010/0070209 | A1 | 3/2010 | Sai |
| 2010/0082881 | A1 | 4/2010 | Klein |
| 2010/0091568 | A1 | 4/2010 | Li et al. |
| 2010/0091573 | A1 | 4/2010 | Li et al. |
| 2010/0265168 | A1 | 10/2010 | Neugebauer |
| 2010/0309719 | A1 | 12/2010 | Li et al. |
| 2011/0066793 | A1 | 3/2011 | Burd |
| 2011/0096601 | A1 | 4/2011 | Gavens et al. |
| 2011/0145633 | A1 | 6/2011 | Dickens et al. |
| 2011/0148509 | A1 | 6/2011 | Pan |
| 2011/0182121 | A1 | 7/2011 | Dutta et al. |
| 2011/0194357 | A1* | 8/2011 | Han ...................... G11C 16/16 365/185.29 |
| 2011/0286279 | A1 | 11/2011 | Lei et al. |
| 2011/0286280 | A1 | 11/2011 | Kellam et al. |
| 2012/0008384 | A1* | 1/2012 | Li .......................... G11C 29/02 365/185.2 |
| 2012/0008405 | A1 | 1/2012 | Shah et al. |
| 2012/0008410 | A1 | 1/2012 | Huynh et al. |
| 2012/0220088 | A1 | 8/2012 | Alsmeier |
| 2012/0281479 | A1 | 11/2012 | Kochar et al. |
| 2012/0311407 | A1 | 12/2012 | Lee et al. |
| 2013/0028021 | A1 | 1/2013 | Sharon et al. |
| 2013/0031429 | A1 | 1/2013 | Sharon et al. |
| 2013/0031430 | A1 | 1/2013 | Sharon |
| 2013/0031431 | A1 | 1/2013 | Sharon et al. |
| 2013/0107628 | A1 | 5/2013 | Dong et al. |
| 2013/0114342 | A1 | 5/2013 | Sakai et al. |
| 2013/0229868 | A1 | 9/2013 | Koh et al. |
| 2014/0003157 | A1 | 1/2014 | Mui et al. |
| 2014/0085985 | A1* | 3/2014 | Pan ...................... G11C 5/145 365/185.18 |
| 2014/0169095 | A1 | 6/2014 | Avila et al. |

FOREIGN PATENT DOCUMENTS

| | | |
|---|---|---|
| WO | 2007016167 | 2/2007 |
| WO | 2007016167 A1 | 2/2007 |

OTHER PUBLICATIONS

Pan, "Charge Pump Circuit Design," McGraw-Hill, 2006, 26 pages.
Pylarinos et al., "Charge Pumps: An Overview," Department of Electrical and Computer Engineering University of Toronto, www.eecg.toronto.edu/~kphang/ece1371/chargepumps.pdf., 7 pages.
U.S. Appl. No. 13/332,780 entitled "Simultaneous Sensing of Multiple Wordlines and Detection of NAND Failures," filed Dec. 21, 2011, 121 pages.
U.S. Appl. No. 13/101,765 entitled "Detection of Broken Word-Lines in Memory Arrays," filed May 5, 2011, 63 pages.
U.S. Appl. No. 13/193,083 entitled "Non-Volatile Memory and Method with Accelerated Post-Write Read Using Combined Verification of Multiple Pages," filed Jul. 28, 2011, 100 pages.

(56) References Cited

OTHER PUBLICATIONS

U.S. Appl. No. 13/280,217 entitled "Post-Write Read in Non-Volatile Memories Using Comparison of Data as Written in Binary and Multi-State Formats," filed Oct. 24, 2011, 110 pages.
U.S. Appl. No. 13/193,148 entitled "Data Recovery for Detection Word Lines During Programming of Non-Volatile Memory Arrays,"filed Jul. 28, 2011, 48 pages.
U.S. Appl. No. 11/303,387 entitled "Charge Pump Regulation Control for Improved Power Efficiency," filed Dec. 16, 2011, 25 pages.
First Office Action issued for Chinese Patent Application No. 2011800340192 mailed on Dec. 2, 2014, 7 pages.
First Office Action issued for Chinese Patent Application No. 2011800388647 mailed on Feb. 3, 2015, 12 pages.
Response to Election/Restriction mailed Jan. 11, 2016 for U.S. Appl. No. 14/328,070, 2 pages.
Requirement for Restriction/Election mailed Nov. 9, 2015 for U.S. Appl. No. 14/328,070, 6 pages.
Notice of Allowance and Fees Due mailed Jun. 20, 2016 for U.S. Appl. No. 14/328,070, 7 pages.
Non-Final Rejection mailed Feb. 12, 2016 for U.S. Appl. No. 14/328,070, 36 pages.
Amendment mailed May 12, 2016 for U.S. Appl. No. 14/328,070, 14 pages.

\* cited by examiner

Programming into four states represented by a 2-bit code

DETERMINATION OF WORD LINE TO WORD LINE SHORTS BETWEEN ADJACENT BLOCKS

PRIORITY CLAIM

The present application is a divisional of U.S. patent application Ser. No. 14/328,070, entitled "DETERMINATION OF WORD LINE TO WORD LINE SHORTS BETWEEN ADJACENT BLOCKS," filed Jul. 10, 2014, which is herein incorporated by reference in its entirety for all purposes.

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that also is solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that flash EEPROM is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

To improve read and program performance, multiple charge storage elements or memory transistors in an array are read or programmed in parallel. Thus, a "page" of memory elements are read or programmed together. In existing memory architectures, a row typically contains several interleaved pages or may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY

A first set of aspects concern a method of operating a memory circuit having an array of multiple blocks of non-volatile memory cells formed along word-lines, a method of determining whether one or more of the word-lines are defective. The method includes performing an intra-block stress operation on one or more blocks of the array and subsequently performing a defect determination operation. The stress operation has a plurality of stress cycles where each stress cycle for a selected block includes: applying a high voltage level to a first set of one or more word lines of the selected block while concurrently setting a second set of one or more word lines of the selected block at a low voltage level, where at least one word line of the first set is adjacent to at least one word line of the second set; and subsequently applying the high voltage level to the second set of word lines while concurrently setting the first set of word lines at the low voltage level. The defect determination operation includes performing a write operation on the selected block and determining whether the write operation was successful.

Other aspects relate to a method of operating a memory circuit having an array of multiple blocks of non-volatile memory cells of an array formed along word-lines, a method of determining whether one or more of the word-lines are defective. The method includes performing an inter-block stress operation on a pair of physically adjacent blocks of the array, including applying a set of stress voltage levels to word lines of the first and second of the pair of blocks to thereby introduce a voltage differential between them and subsequently performing a defect determination operation. The defect determination operation includes: performing an erase operation on the pair of physically adjacent blocks; determining whether the erase operation was successfully completed; subsequently performing a write operation on the pair of physically adjacent blocks; and determining whether the write operation was successful.

Further aspect concern a method of operating a non-volatile memory circuit including an array of non-volatile memory cells formed according to a NAND type architecture and having first and second physically adjacent, independently biasable select gate lines. The method includes performing select gate to select gate stress operation on the first and second select lines and subsequently performing a defect determination operation on the first and second select lines to determine leakage between them. The select gate to select gate stress operation applies a set of stress voltage levels to the first and second select lines to thereby introduce a voltage differential between the first and second select lines.

Additional aspects present a method of operating an non-volatile memory circuit including an array of non-volatile memory cells formed according to a NAND type architecture and having a first word line physically adjacent to a first select gate line. The method performs word line to select gate stress operation on the first word line and the first select gate line, including applying a set of stress voltage levels to the first word line and first select gate line to thereby introduce a voltage differential between them. A defect determination operation is subsequently performed on the first word line and first select gate line to determine leakage between them.

Other aspects relate to a method of determining whether one or more blocks of a semi-conductor memory device are defective, where the memory device is formed of multiple blocks, each formed of a plurality of NAND strings having multiple memory cells connected in series between one or more source select gates and one or more drain select gates, the memory cells being connected along word lines and the source and drain select gates being respectively connected along source and drain select lines, where each of a block's NAND strings are connected though the corresponding source select gates to a local source line. A stress operation is performed on a selected block, where the stress operation includes applying a high voltage to the local source line; and concurrently setting the word lines, source select lines and drain select lines to a low voltage. A defect determination operation is subsequently performed, where this includes performing a write operation on the selected blocks and determining whether the write operation was successful.

Other aspects also relate to a method of determining defective bit lines in a non-volatile memory circuit having a plurality of memory cells each connectable by an associated one of a plurality of bit lines to one of a plurality of sense amps, each of the bit lines connectable to an associated sense amp by a corresponding switch. The method includes performing a bit line stress operation and subsequently performing a defect determination operation. The bit line stress operation includes applying a high voltage level to the first set of one or more bit lines while setting the sense amps associated a second set of one or more bit lines set to a sense amp operating level while the corresponding switches for the first and second sets are off, where at least one bit line of the first set of bit lines is adjacent to at least one of the sense amps associated with the second set of bit lines. The defect determination operation includes: with the corresponding switches closed and the sense amps associated with of the second set of bit lines set to the sense amp operating level, supplying the first set of bit lines from a high voltage supply; and determining whether the high voltage supply can maintain the first set of bit lines at a first voltage level.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
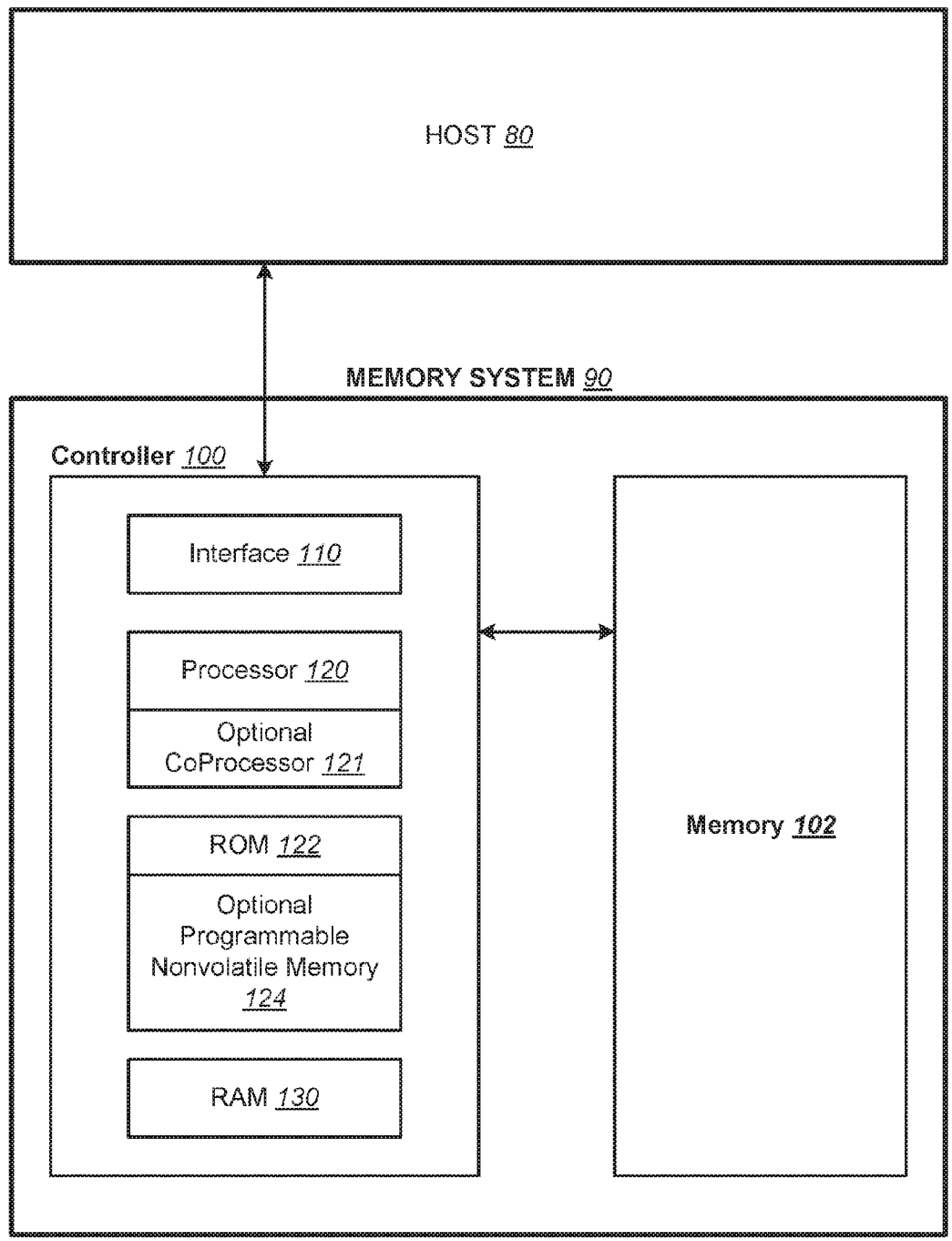
FIG. 1 illustrates schematically the main hardware components of a memory system suitable for implementing the present invention.

FIG. 1 illustrates schematically the main hardware components of a memory system 90 suitable for implementing the present invention. Memory system 90 typically operates with a host 80 through a host interface. Memory system 90 may be in the form of a removable memory such as a memory card, or may be in the form of an embedded memory system. Memory system 90 includes a memory 102 whose operations are controlled by a controller 100. Memory 102 comprises one or more arrays of non-volatile memory cells distributed over one or more integrated circuit chips. Controller 100 may include interface circuits 110, a processor 120, ROM (read-only-memory) 122, RAM (random access memory) 130, programmable nonvolatile memory 124, and additional components. Controller 100 is typically formed as an ASIC (application specific integrated circuit) and the components included in such an ASIC generally depend on the particular application.

With respect to memory 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which also can be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional (2D) memory structure or a 3D memory structure.

In a 2D memory structure, the semiconductor memory elements are arranged in a single plane or a single memory device level. Typically, in a 2D memory structure, memory elements are arranged in a plane (e.g., in an x-z direction plane) which extends substantially parallel to a major surface of a substrate that supports the memory elements. The substrate may be a wafer over or in which the layer of the memory elements are formed or may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions also can constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays also may be designed in a NOR configuration and in a ReRAM configuration.

Typically, in a monolithic 3D memory array, one or more memory device levels are formed above a single substrate. Optionally, the monolithic 3D memory array also may have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, 2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D exemplary structures described but cover all relevant memory structures within the spirit and scope of the invention as described herein and as understood by one of skill in the art.

Physical Memory Structure

Figure 2:
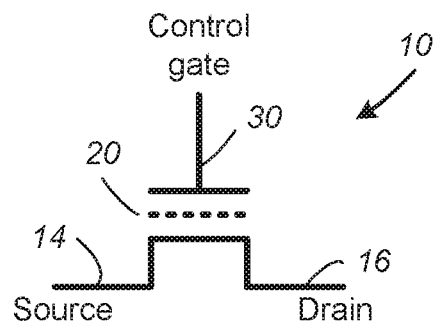
FIG. 2 illustrates schematically a non-volatile memory cell.

FIG. 2 illustrates schematically a non-volatile memory cell 10. Memory cell 10 can be implemented by a field-effect transistor having a charge storage element 20, such as a floating gate or a charge trapping (dielectric) layer. Memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, 21:11, November 2000, pp. 543-545, and in U.S. Pat. Nos. 5,768,192 and 6,011,725.

In practice, the memory state of a memory cell is usually read by sensing the conduction current across the source and drain electrodes of the memory cell when a reference voltage is applied to the control gate. Thus, for each given charge on the floating gate of a memory cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, the threshold voltage for a given memory state under test may be set at the control gate and a determination may be made whether the conduction current is lower or higher than a threshold current (cell-read reference current). In one implementation the detection of the conduction current relative to a threshold current is accomplished by examining the rate the conduction current is discharging through the capacitance of the bit line.

Figure 3:
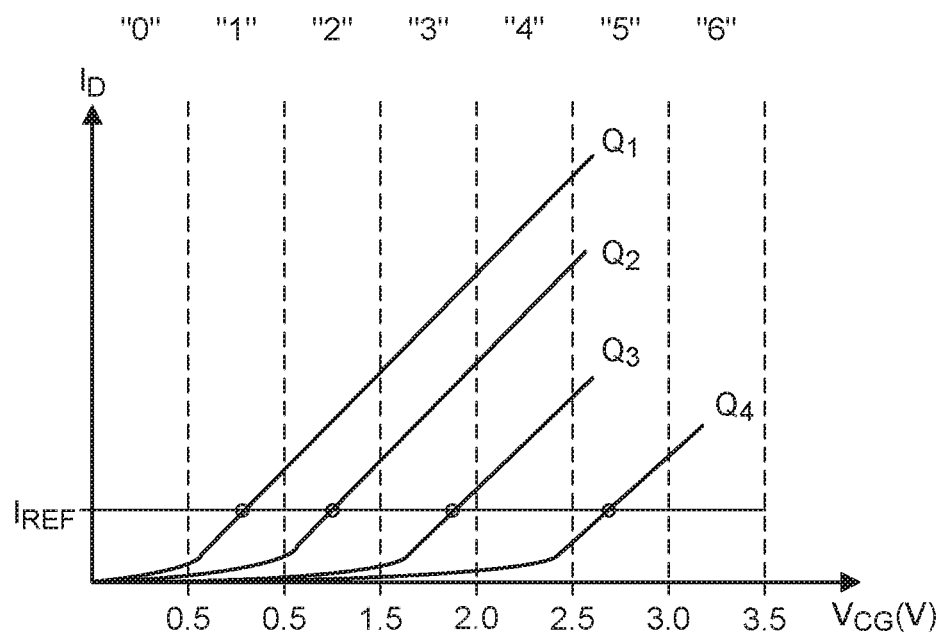
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states.

As an example, the threshold voltage window of a population of cells may range from 0.5V to 3.5V. Seven possible programmed memory states "0," "1," "2," "3," "4," "5," "6," and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" because its curve intersects with $I_{REF}$ in the region of the threshold window demarcated by VCG=0.5V and 1.0V. Similarly, Q4 is in a memory state "5."

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store sixteen states, each state may occupy from 200 mV to 300 mV in the threshold window. This will require higher precision in programming and reading operations to be able to achieve the required resolution.

NAND Structure

Figure 4:
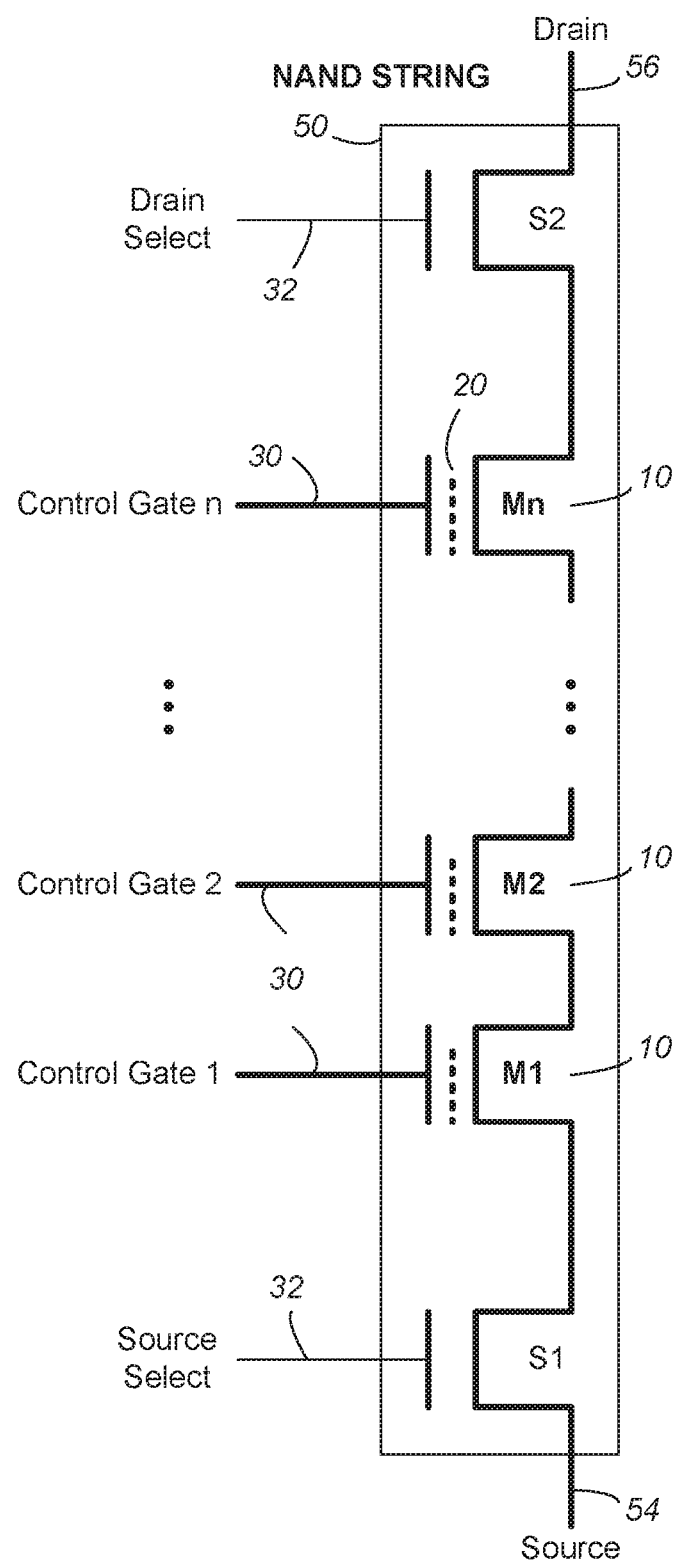
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array.

Each memory transistor in the chain acts as a memory cell, and has a charge storage element 20 to store a given amount of charge to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor within a NAND string is read or is verified during programming, its control gate 30 is supplied with an appropriate voltage. At the same time, the rest of the non-addressed memory transistors in NAND string 50 are fully turned on by application of sufficient voltage on their control gates. In this way, a conductive path is effectively created from the source of the individual memory transistor to the source terminal 54 of the NAND string and likewise for the drain of the individual memory transistor to drain terminal 56 of the memory cell.

Memory devices with such NAND string structures are described in U.S. Pat. Nos. 5,570,315, 5,903,495, 6,046,935.

Figure 5:
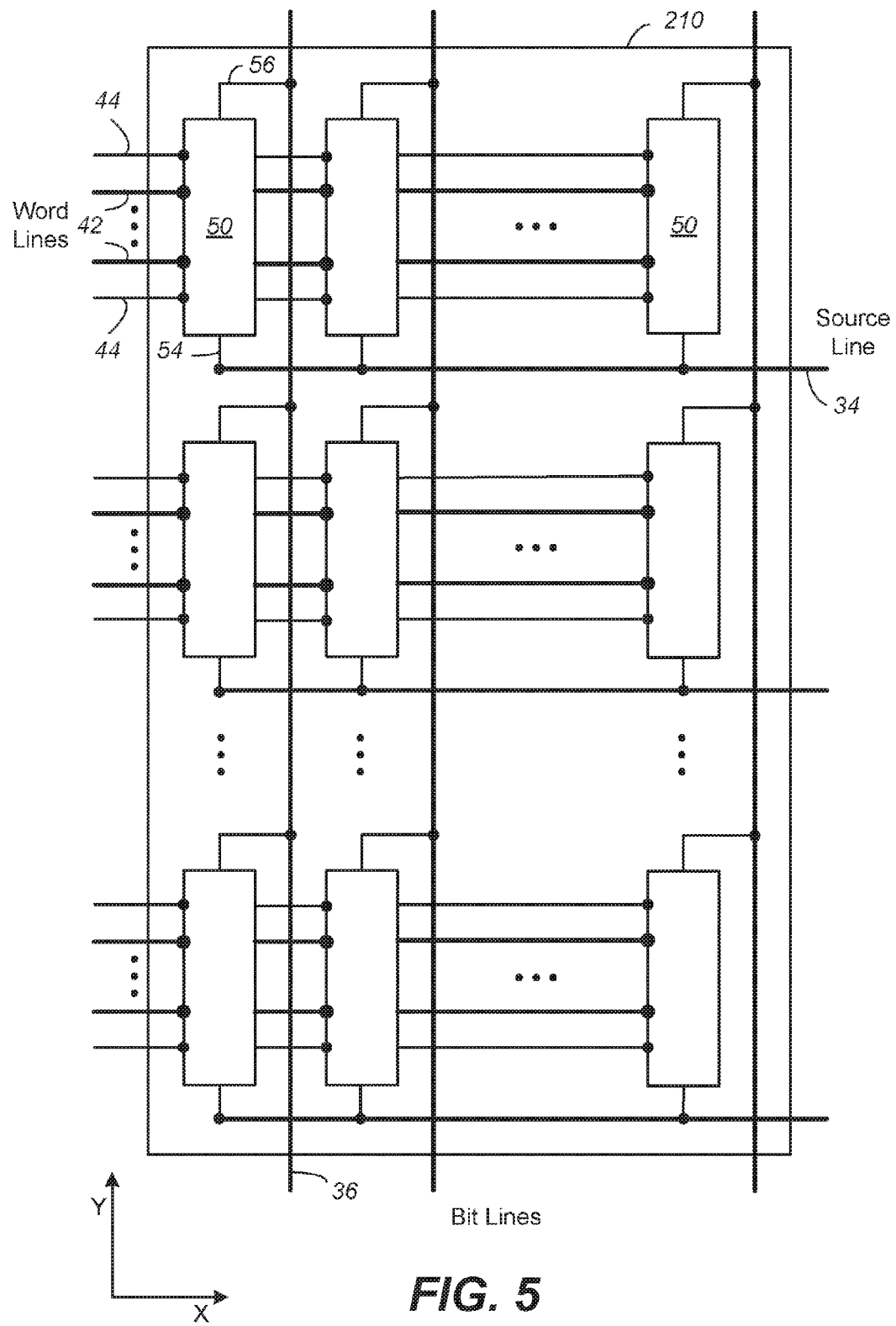
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to drain terminal 56 of each NAND string 50. Along each bank of NAND strings 50, a source line such as source line 34 is coupled to the source terminals 54 of each NAND string 50. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
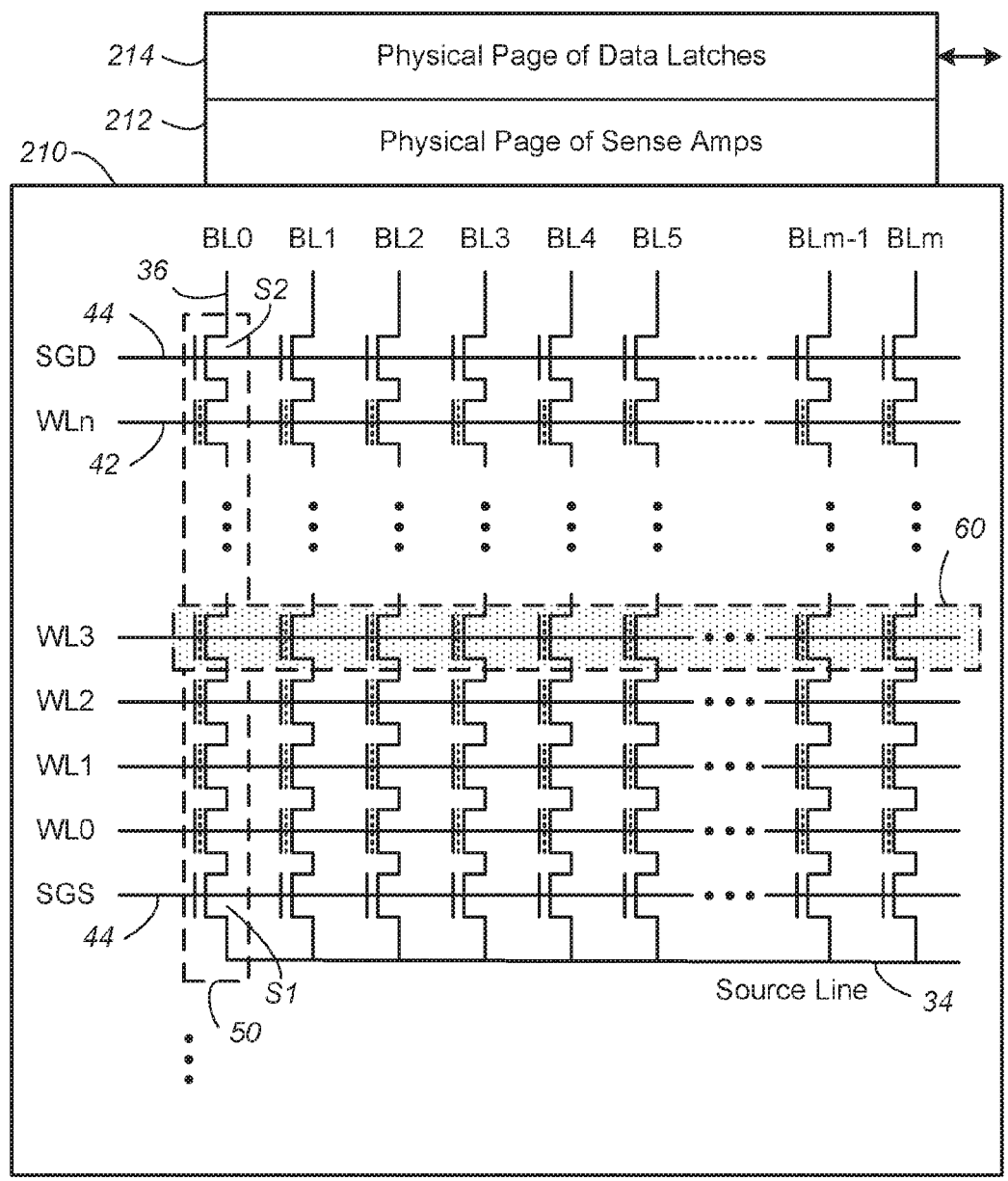
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in NAND array 210 of FIG. 5, where the detail of each NAND string is shown explicitly as in FIG. 4. A physical page, such as page 60, is a group of memory cells enabled to be sensed or programmed in parallel. This is accomplished by a corresponding page of sense amplifiers 212. The sensed results are latched in a corresponding set of latches 214.

Each sense amplifier 212 can be coupled to a NAND string 50 via a bit line 36. The page is enabled by the control gates of the cells of the page connected in common to a word line 42 and each cell accessible by a sense amplifier accessible via a bit line 36. As an example, when respectively sensing or programming cells of page 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is, the floating gate must first be emptied of charge. Programming then adds a desired amount of charge back to the floating gate. Flash memory does not support removing a portion of the charge from the floating gate to go from a more programmed state to a lesser one. This means that updated data cannot overwrite existing data and must be written to a previous unwritten location.

Furthermore, erasing is to empty all the charges from the floating gate and generally takes appreciable time. For that reason erasing cell by cell or even page by page is cumbersome and very slow. In practice, the array of memory cells is divided into a large number of blocks of memory cells. As is common for flash EEPROM systems, the block is the unit of erase. That is, each block contains the minimum number of memory cells that are erased together. Although aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7A:
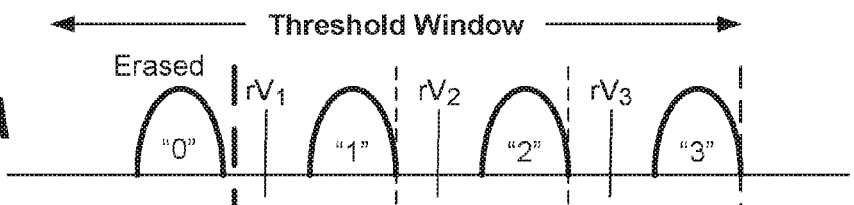
FIGS. 7A-7C illustrate an example of programming a population of memory cells.
Figure 7B:
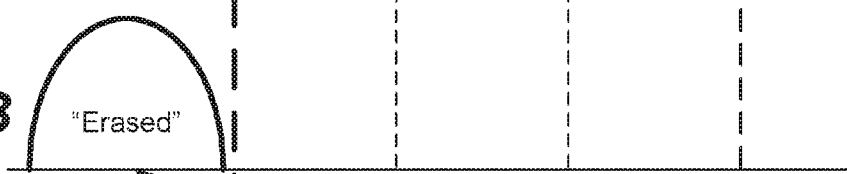
Figure 7C:
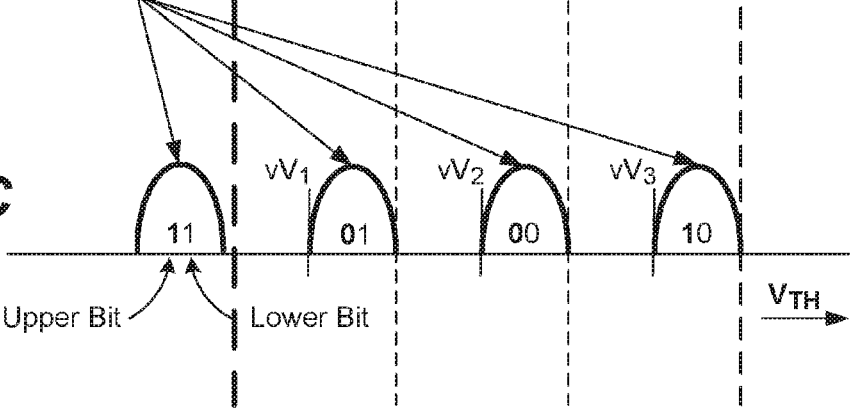

FIG. 7A-7C illustrate an example of programming a population of 4-state memory cells. FIG. 7A illustrates the population of memory cells programmable into four distinct distributions of threshold voltages respectively representing memory states "0," "1," "2," and "3." FIG. 7B illustrates the initial distribution of "erased" threshold voltages for an erased memory.

FIG. 7C illustrates an example of the memory after many of the memory cells have been programmed. Essentially, a cell initially has an "erased" threshold voltage and programming will move the threshold voltage to a higher value into one of the three zones demarcated by verify levels vV1, vV2 and vV3. In this way, each memory cell can be programmed to one of the three programmed states "1," "2," and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0," "1," "2," and "3" states are respectively represented by "11," "01," "00," and '10." The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g., source) at the wafer surface and the other end (e.g., drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8:
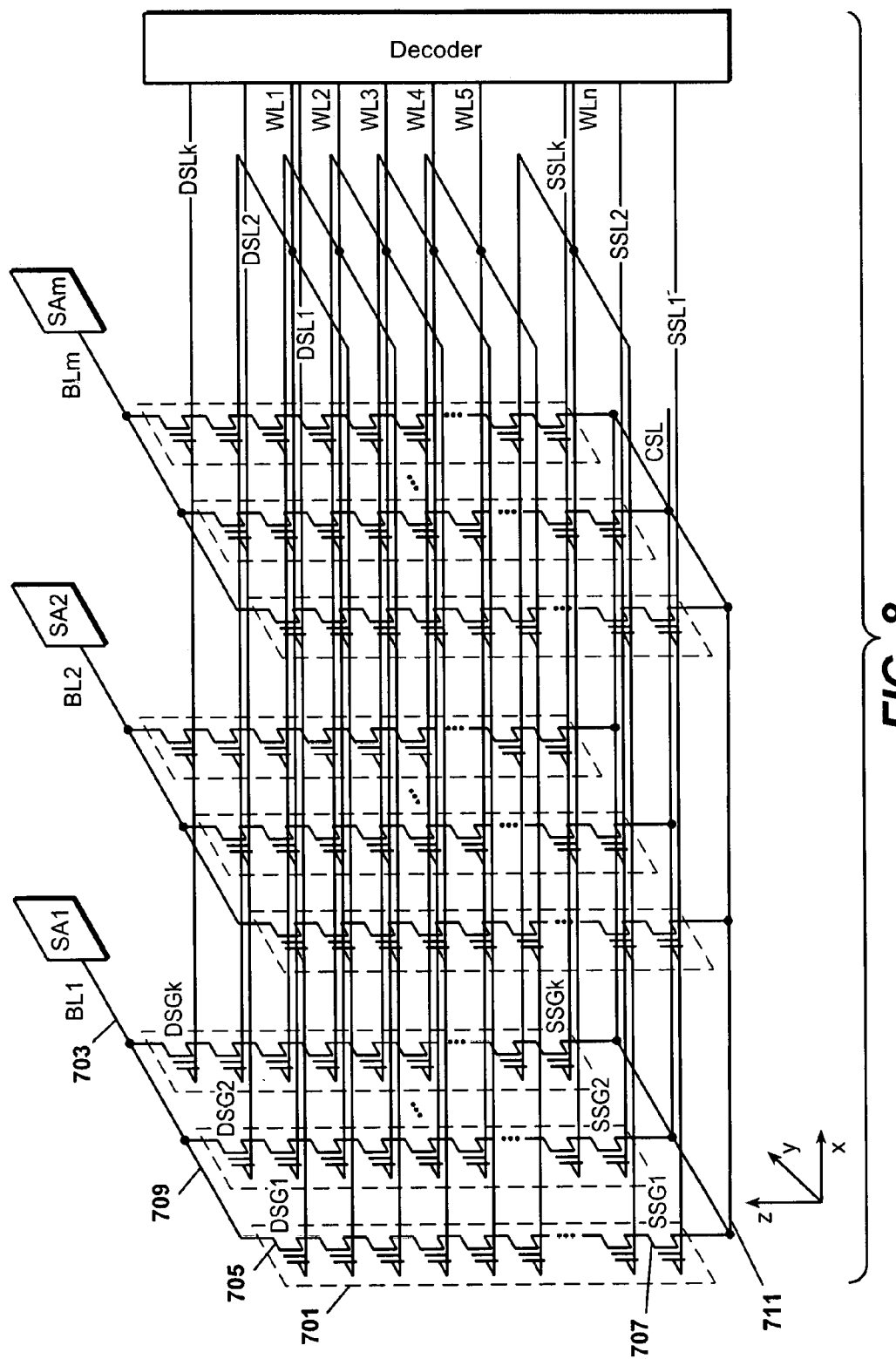
FIG. 8 shows an example of a physical structure of a 3-D NAND string.

FIG. 8 shows a first example of a NAND string 701 that extends in a vertical direction, i.e., extending in the z-direction, perpendicular to the x-y plane of the substrate. Memory cells are formed where a vertical bit line (local bit line) 703 passes through a word line (e.g., WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. Although FIG. 8 shows an example of a NAND string that has 32 cells (0-31) connected in series, the number of cells in a NAND string may be any suitable number. Not all cells are shown for clarity. Persons of ordinary skill in the art will understand that additional cells are formed where word lines 3-29 (not shown) intersect the local vertical bit line.

A 3D NAND array can, loosely speaking, be formed tilting up the respective NAND strings 50 and NAND array 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
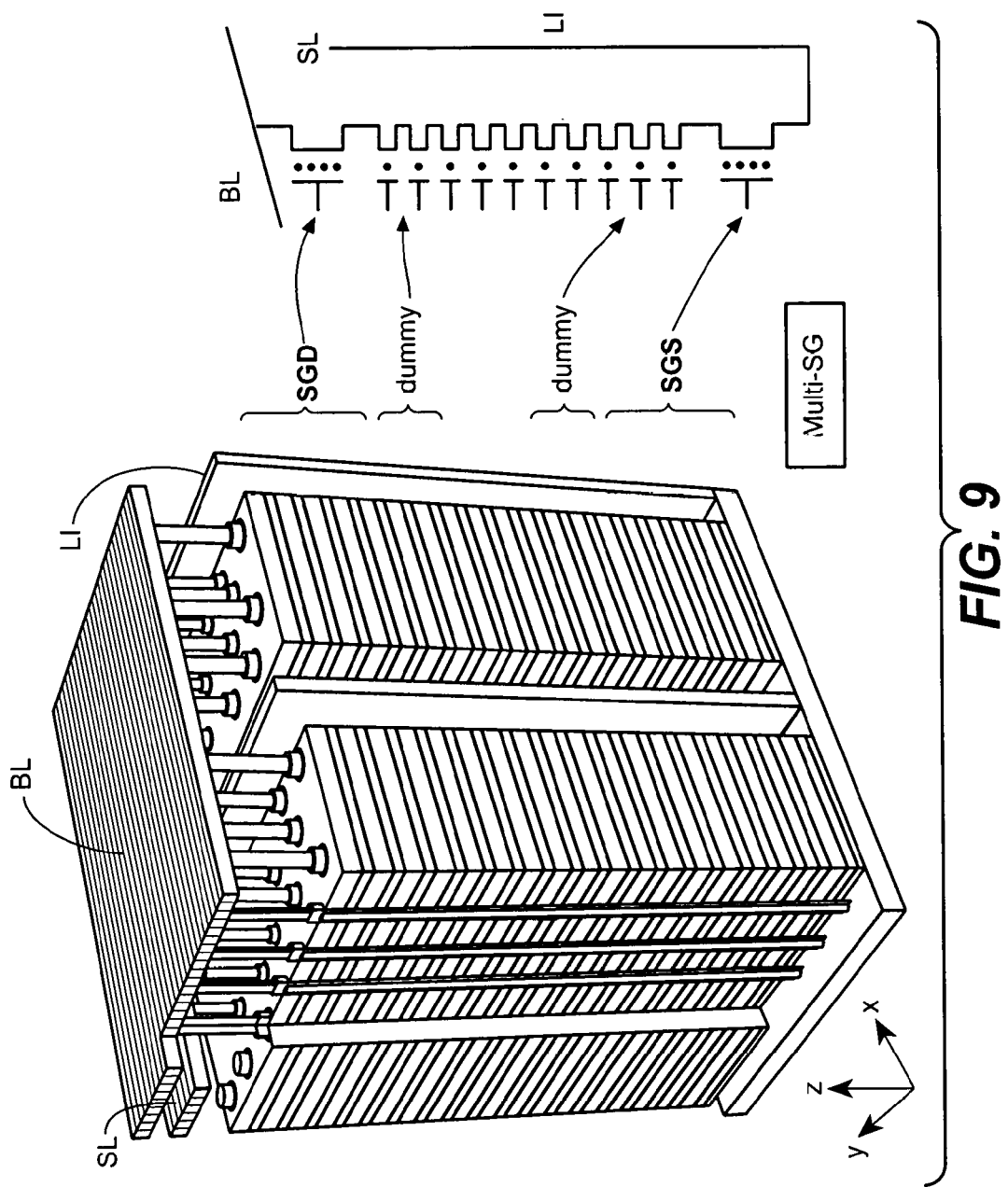
FIGS. 9-12 look at a particular monolithic three dimensional (3D) memory array of the NAND type (more specifically of the "BiCS" type).

FIGS. 9-12 look at a particular monolithic 3D memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block.

Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger.

Depending on the embodiment, the global source lines can span the whole, or just a portion, of the array structure. Rather than use the local interconnect (LI), variations can include the NAND string being formed in a U type structure, where part of the string itself runs back up, such as is described in U.S. patent application Ser. No. 13/927,659, filed on Jun. 26, 2013.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. Having a select gate with a greater length than that of memory cells is often useful, where this can alternately be achieved by having several select gates in series (as described in U.S. patent application Ser. No. 13/925,662, filed on Jun. 24, 2013), making for more uniform processing of layers.

Additionally, the select gates are programmable to have their threshold levels adjusted, aspects of which are described in U.S. Patent Application Serial No. 2014-0169095. This exemplary embodiment also includes several dummy cells at the ends that are not used to store user data, as their proximity to the select gates makes them more prone to disturbs.

Figure 10:
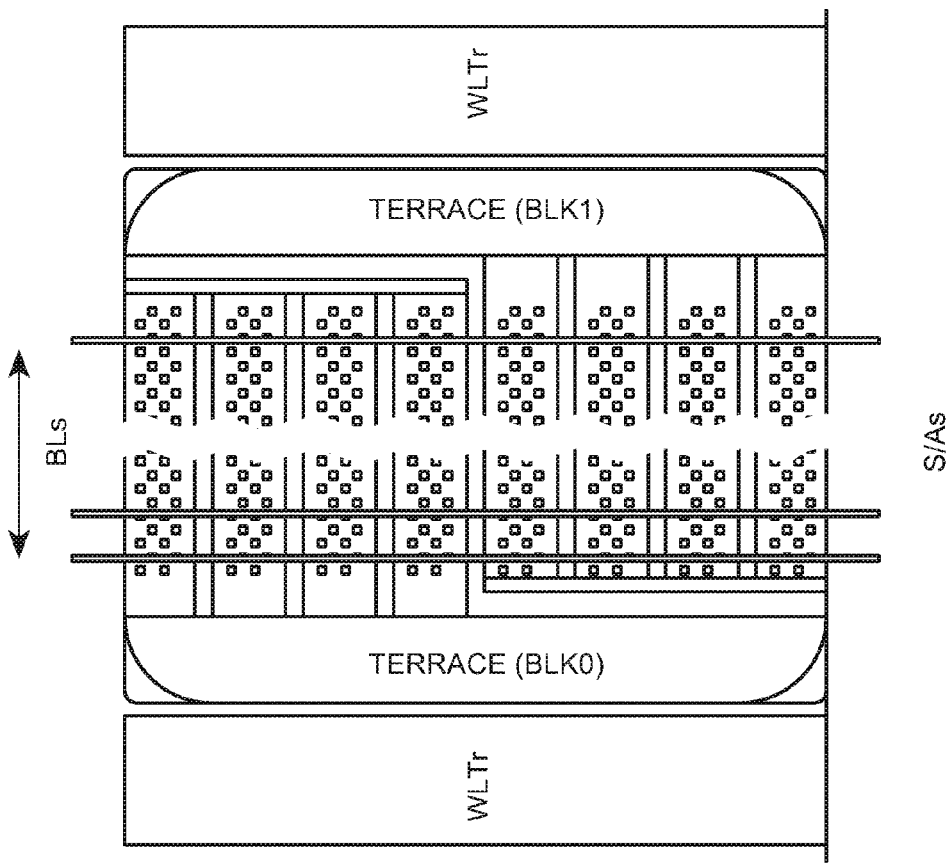

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr.

The word lines of a given layer in a block also can be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
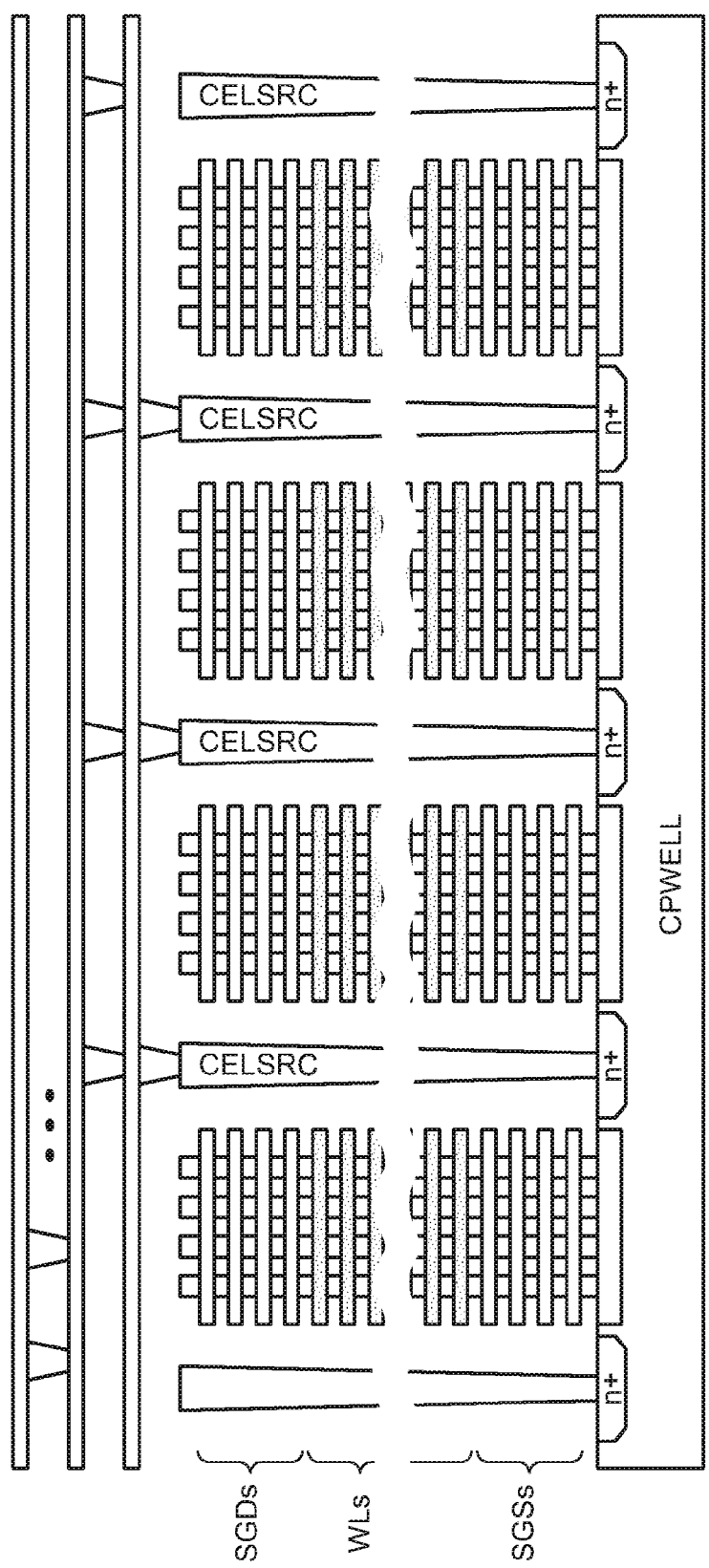

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
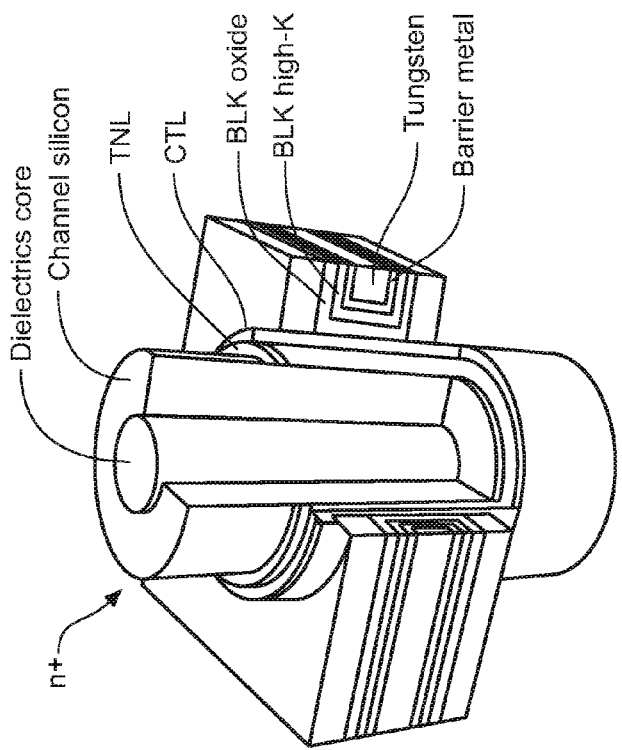

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Array Structure Defects

Memory arrays such as those described above are often subject to various defects, such as broken or leaky word lines and bit lines. A number of techniques for the determining of, and the dealing with, these sorts of problems are presented in the following U.S. Patent Publication Nos.: 2012-0008405; 2012-0008384; 2012-0008410; 2012-0281479; 2013-0031429; 2013-0031429; and US2013-0229868.

The following present a number of additional techniques in the context of the sort of 3D memory structures described above with respect to FIGS. 9-12. Although these techniques are particularly applicable to such structures, many of them are more generally applicable, such as to 2D NAND and other array structures.

Word Line to Word Line Shorts, Same Block: AC Stress Mode

Figure 13:
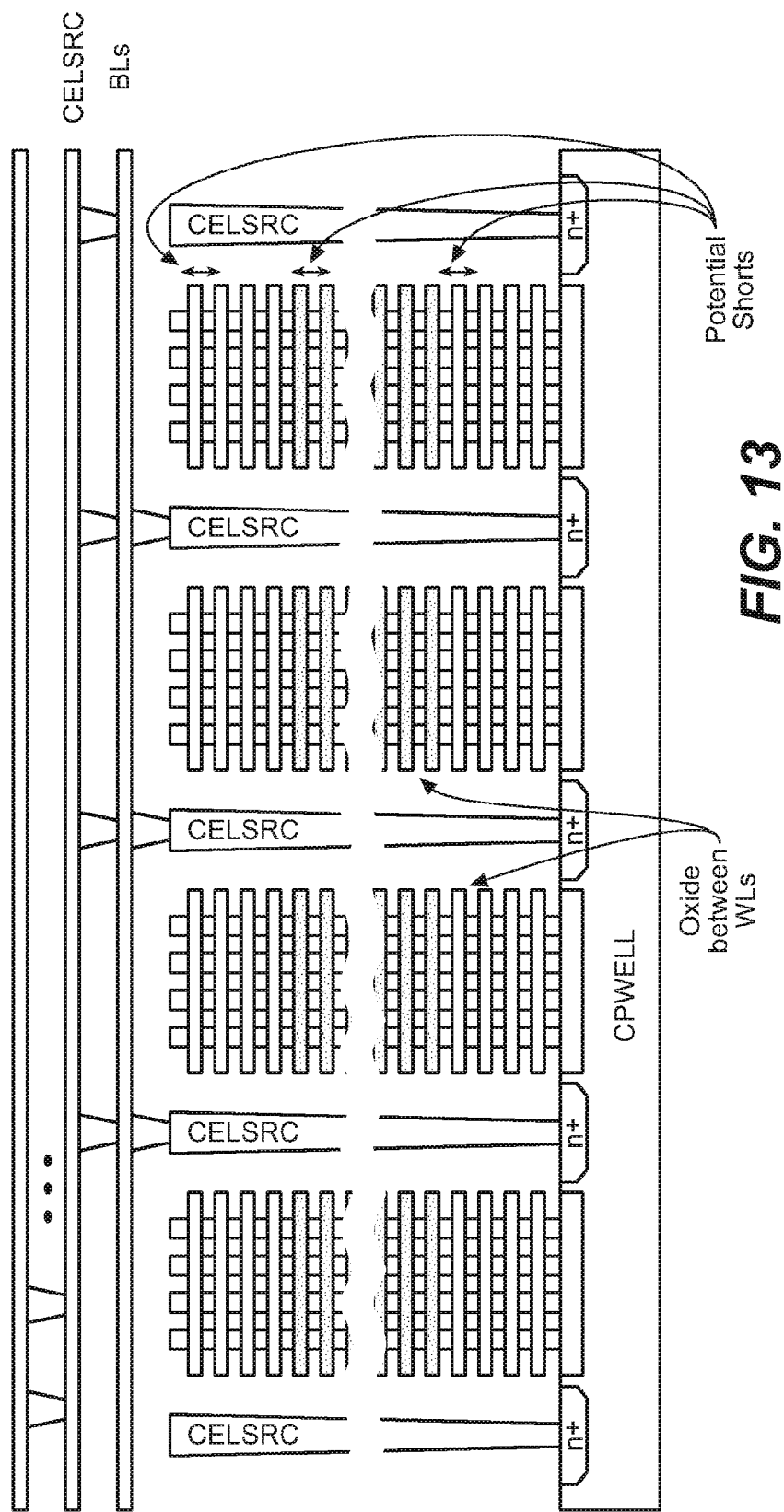
FIG. 13 is a side view of a block, similar to FIG. 11, but with some of the features highlighted.

This section considers shorts between word lines between of the same block, whether in a 2D array or a 3D. In a 3D arrangement, such as illustrated in the FIGS. 9-12, a number of word lines are stacked on top of each other, with an oxide layer in between the pairs of word lines to act as an insulating layer. If this oxide layer is not deposited uniformly or, due to some contamination, is thinner than the target values, the oxide can fail at some point, leading to a short. The stress mode described in this section can accelerate the failure to occur as part of a defect determination process. FIG. 13 can help to illustrate the problem.

FIG. 13 is a side view of a block, similar to FIG. 11, but with some of the features relevant to the current discussion highlighted. As before, four fingers of a block are shown with some of the global bit lines, source lines and so on running across the top. More specifically, the two arrows to the right show two of the gaps between word lines that would be filled with oxide. As discussed further below, these oxide layers are also between select gate lines, as shown in the second finger. The potential word line to word line shorts would then be across these oxide layers, such as illustrated at the right most finger.

A number of references cited above present techniques for determining such shorts. Typically, these use a DC stress applied to the word lines. This section uses an AC stress that in the exemplary embodiment is applied to the odd and even word lines. For example, while toggling the even word lines to a high voltage level VH, the odd word lines are toggled to a low voltage level VL.

More generally, this can be done to with two sets of word lines, such as a portion of the word lines, where the two sets have at least one word line from each that is adjacent. VH is taken as a high voltage level such that the Delta (VH-VL) is high enough to stress the oxide in between adjacent WLs. For example, VH can be as high as 20V to reflect the sort of word line stress levels seen due to program and erase voltage levels used on the device. VL can be the low level (ground or VSS) on the device. This toggling is illustrated schematically in FIG. 14, that shows the voltage levels being applied to the two sets of word lines.

Figure 14:
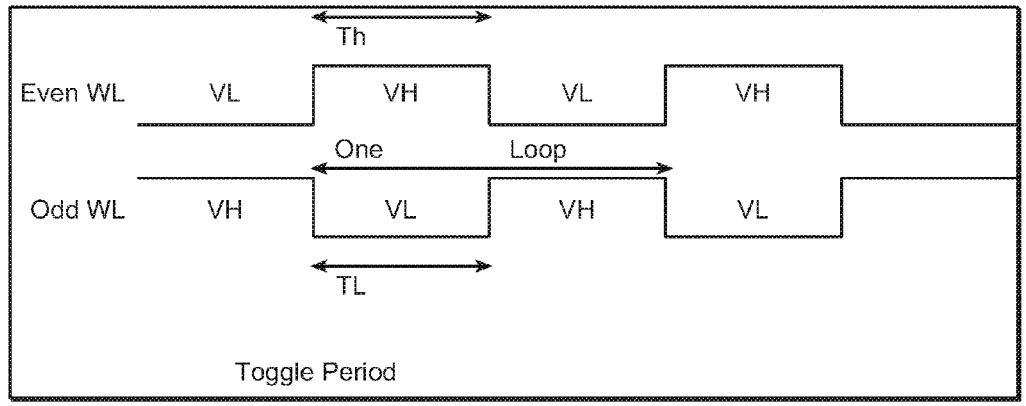
FIG. 14 shows the toggling of voltage levels being applied to the two sets of word lines to apply an AC stress.

As shown in FIG. 14, the even word lines alternately have the VL and VH levels applied, with the odd word lines being similarly toggled but with the phase reversed. These waveforms can be based on a number of settable parameters, including the time period of the VH level, defined by parameter Th, and the time period of VL level, defined by parameter TL. Th and TL can be adjusted to have Delta (VH-VL) between adjacent WLs for a fixed duration.

In case the rise or the fall time of VH and VL differ, the parameters Th and TL can be adjusted to achieve a desired duration of the stress in each cycle. The number of loops of this AC stress also can be parameterized (loop count parameter) to prevent any kind of over kill or under kill. Although the exemplary embodiment applies these levels along the sets of even and odd word lines, as noted above this can be done on other subsets that have one or more adjacent word lines within the block or finger.

Figure 15:
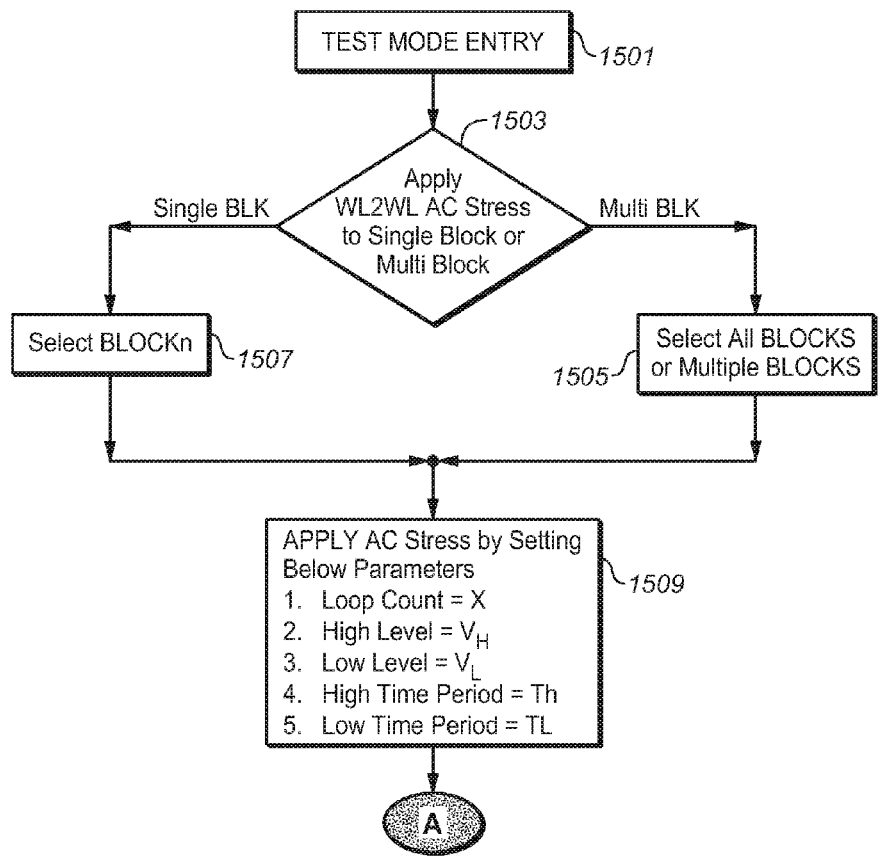
FIGS. 15 and 16 show an exemplary flow for an on-chip AC stress and defect determination process for word line to word line shorts within a block.
Figure 16:
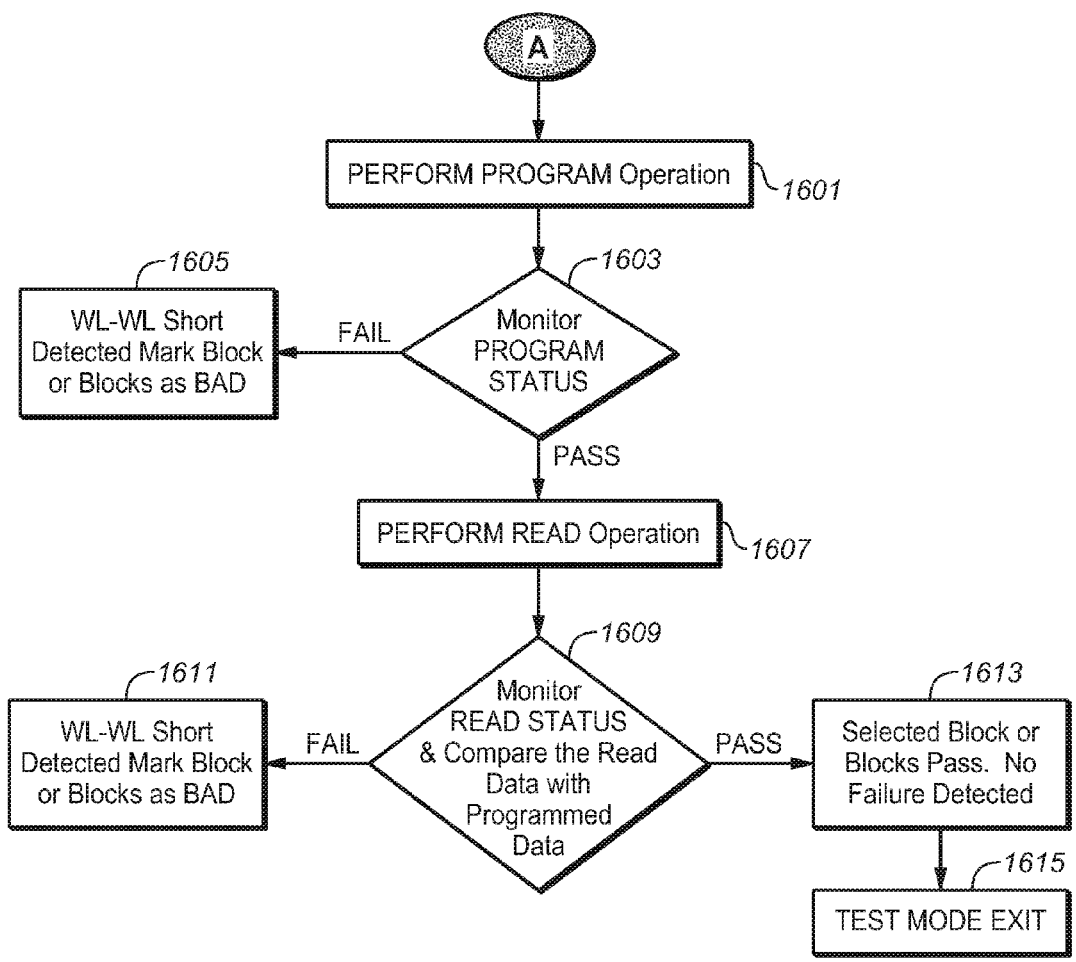

FIGS. 15 and 16 are an exemplary flow for the on-chip stress (FIG. 15) and defect determination (FIG. 16) process. The process begins with the test mode entry at 1501. This will typically be part of an initial test process, done before a device is packaged or shipped, to determine defective die, but also can be done after the device has been in operation for some time, where this could them be implemented at the system level and with possible adjustments to the parameters (see 1509).

At 1503 a determination is made whether to just do a single block test or multiple, even all, blocks. In other embodiments, partial block test also can be done. The block (1507) or blocks (1505) are then selected. The stress is then applied at 1509, which show the parameters involved. The idea is to apply the stress to break any weak spots during the test, basically forcing the issue, rather than wait for these failures to occur during operation.

After the stress operation comes the defect determination operation. A number of techniques for this are described in U.S. Patent Publication Nos.: 2012-0008405; 2012-0008384; 2012-0008410; 2012-0281479; 2013-0031429; 2013-0031429; and US2013-0229868. For the exemplary flow here, the stressed block or blocks are programmed and then can be read back to check for failures.

The flow picks up at 1601 with a program operation, the status of which is monitored at 1603. If the write operation fails (1605), the bad block or blocks are marked as such and not used. Alternately, this (as well as 1611 below) also could be done at the word line level. If the program operation passes, the detection can then move on to a read operation at 1607. The read status is monitored at 1609 by, for example, comparing the data as read back with the data that was originally programmed. If the read status comes back as a fail, then the bad block or blocks can be marked (1611) as such. If the tested blocks pass (1613), the test mode can then exited (1615).

For the defect determination operation, determining whether a program operation has failed can be based on a word line failing by exceeding maximum number of program loops or on the read operation coming back with a failed bit count exceeding a limit. The data written and read back for this process can be a random pattern, either predetermined or not.

In either case, the comparison of the read back data can be based on a comparison of the data pattern that was to be written, each by maintaining a copy or because the data pattern that was to be written is based on a known, predetermined pattern. Rather than a direct comparison, a comparison can alternately (or additional) be based on ECC and whether the data can be extracted within the ECC capabilities.

Figure 17:
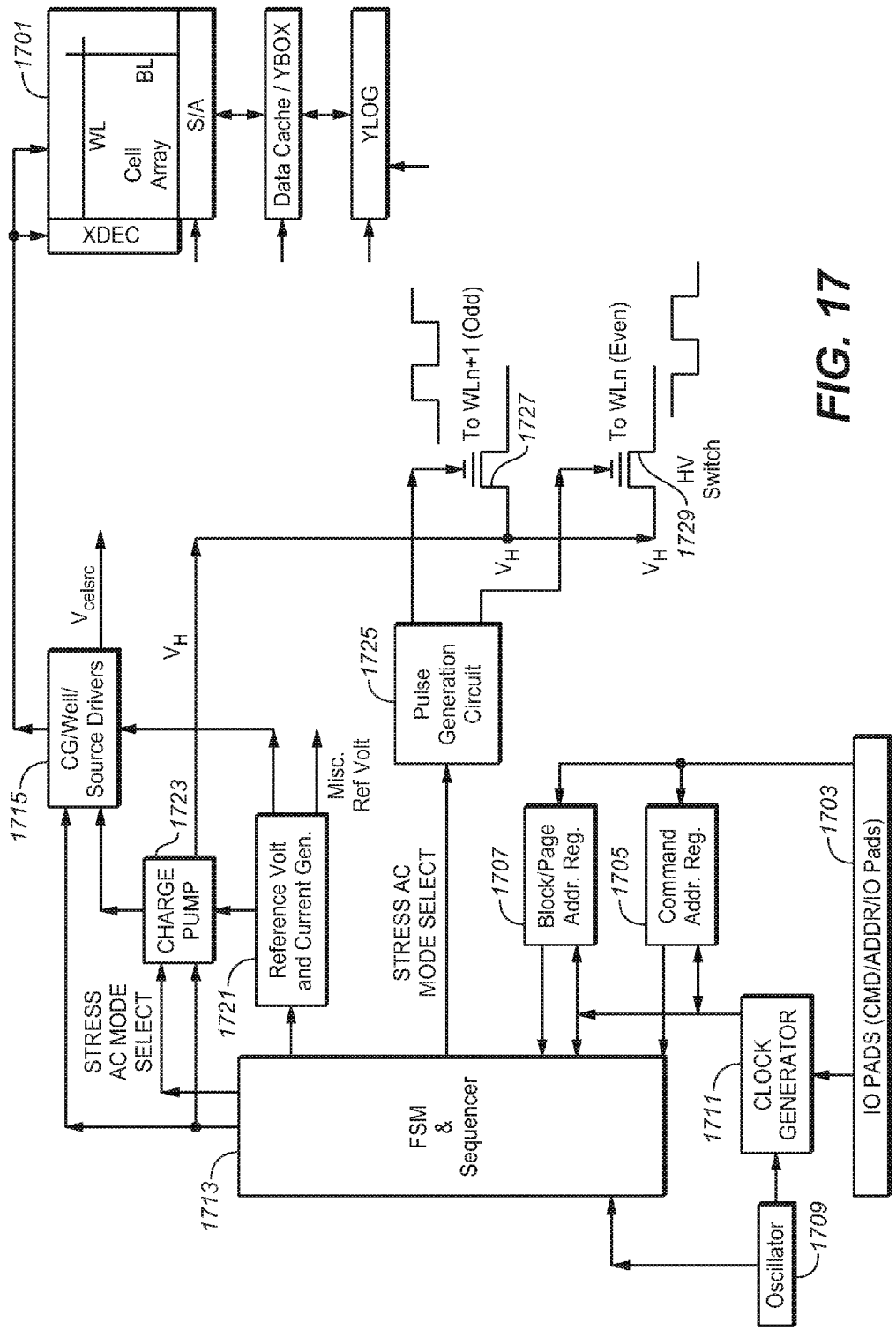
FIG. 17 is a schematic representation of some of the elements on the memory chip that are involved in the process of FIGS. 15 and 16.

FIG. 17 is a schematic representation of some of the elements on the memory chip that are involved in this process. A number of different embodiments are possible, but shows some of the basic elements. The array 1701 and its associated decoding and sensing circuitry can be of the BiCS or other 3D variety, but is here shown in more of a 2D sort of representation for simplicity. The memory circuit has a set of IO pads 1703 for commands, addresses and data transfer, which can then be passed on to command and block/page address registers (1705, 1707).

An oscillator 1709 can be used with the clock generator to provide needed clock signals. An finite state machine (FSM) and Sequencer block 1713 represented to on-chip control logic that controls various drivers 1715 for array 1701. Reference voltage and current generators 1721 supply the various reference levels, including those supplied to a charge pump circuits block 1723, which generates the high level VH applied to the word lines in the intra-block AC stress mode of this section. A pulse generation circuit, here schematically separated out as block 1725, will then supply the stress level to the selected block when enabled by mode select signal, as schematically represented by the control signals to the control gates of high voltage switches 1727 and 1729.

For any of the variations, these techniques can be effect for detecting current or incipient word line to word line shorts within a given block, without over identification, improving the identified defective parts per million (DPPM) value. This process can be implemented as a built in self-test (BIST) process that can help in reducing test times and also gives the option to perform the stress at the system level at other times, such as before performing a block.

Word Line to Word Line Shorts, Adjacent Blocks

In most non-volatile array structures, the issue of word line to word line shorts is traditional an issue for word lines within a common blocks. In some structures, such as the sort of 3D BiCS-type structure described above with respect to FIGS. 9-12, word lines from different, but physically adjacent blocks can be in close proximity. This section looks at the detection of such inter-block word line to word line shorts. As can be seen from FIG. 9, where the two shown fingers are from different blocks, word lines on the same vertical level from different blocks can be closely placed, separated by a distance that will decrease as device scales continue to shrink.

Word line to word line shorts from adjacent blocks can manifest themselves as erase disturbs, program disturbs, or both. For example, consider the case where a block X is already in a programmed state and unselected for erase, but an adjacent block, block X+1, is selected for erase. In case of a short between a word line WLn of block X and word line of block X+1, when applying the erase voltage level to block X+1, the erased bias level will transfer across the shorted word line WLn to block X, causing some degree of erase there so that block X will lose already programmed data, resulting in erase disturb there.

Similarly, if block X is already programmed and meant to be unselected for additional programming while the adjacent block X+1 is selected for programming, when a programming pulse is applied along WLn in block X+1, this will be transferred across the short. WLn in block X be get over programmed and WLn of block X+1 will see high loading, resulting in program disturb there.

Figure 18:
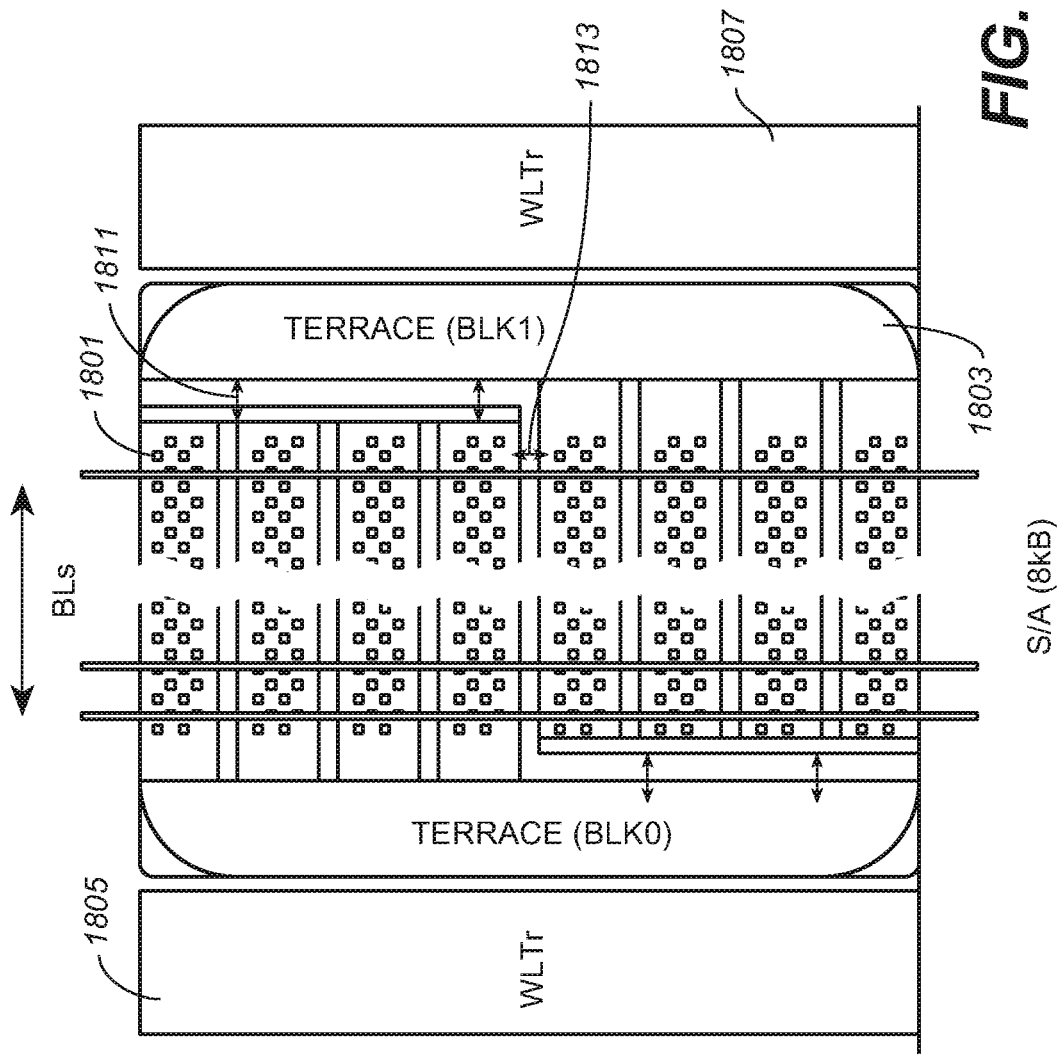
FIG. 18 is a top level, top down diagram of how blocks are paired and placed next to each other in the exemplary embodiment of FIGS. 9-12.

FIG. 18 is a top level, top down diagram of how blocks are paired and placed next to each other in the exemplary embodiment. The four (in this embodiment) fingers of block 0 1801 are at top, with each word line in the stack connected to a corresponding terrace level that in addition to being to the left of the fingers of block 0, are also in proximity to the fingers of block 1 1803. To the left and right are the respective transfer gates for block 0 (1805) and block 1 (1807). The bit lines then run up and down in this view, connecting the NAND strings running into the page to the associated sense amps.

The arrows show some of the examples of where inter-block word line shorts can occur, such as between a word line of one block and the other blocks terrace region 1811 or between the word lines of adjacent fingers of different blocks 1813. Also this discussion is given in the context of the BiCS type structure, the described technology also can be applied to other structures where word lines of one block are in proximity to the word lines of another block.

The process for determining inter-block word line to word line shorts between adjacent blocks can again use a stress operation and a detection operation, where the stress phase can be an AC or DC stress. The high level VH is again a high voltage level such that the Delta (VH-VL) is high enough to stress the oxide or weak defect in between adjacent word lines. VH can be as high as 20V to correspond to the stresses the device will see during erase and write operations.

The low level VL is similarly such that the Delta (VH-VL) is high enough to stress the oxide or weak defect in between adjacent word lines, where VL can be as low as the low on-chip level of VSS or ground. After the stress mode, whether AC or DC, a word line to word line leakage determination can then be done to check pass/fail status using decoder circuit, modified as appropriate.

The inter-block stress between word lines can be applied in a number of ways. For example, a differing bias can be applied on the word lines from even and odd blocks. In one embodiment, this could be applying a high voltage to all word lines on even blocks and a low voltage to odd block, or vice versa. This will create a stress between word lines of physically adjacent blocks to be able to weed out defects at time at test time. This stress can be applied to two or more physically adjacent blocks at a time.

Figure 19:
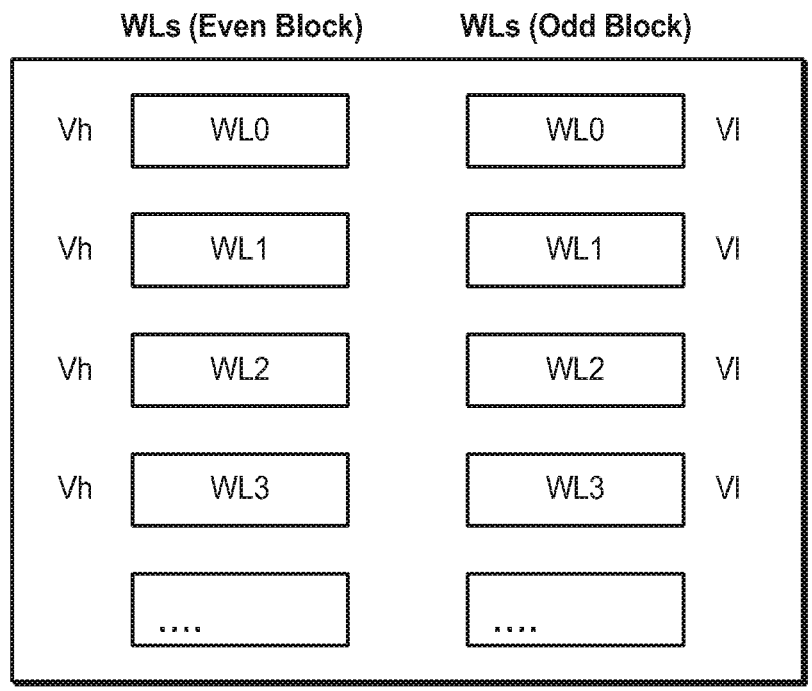
FIGS. 19 and 20 schematically represents two example of the word line levels as applied to even and odd block in an inter-block stress mode.

FIG. 19 schematically represents the word line levels as applied to even and odd block under this arrangements, where the word lines on even blocks are set high and the odd word lines are set low, where this also can be done the other way around. These levels can then be held for some duration in a DC stress mode, or toggled over a number of cycles. These levels can then be applied to by the corresponding decoding circuitry and transfer gates to the word lines according to this pattern.

Figure 20:
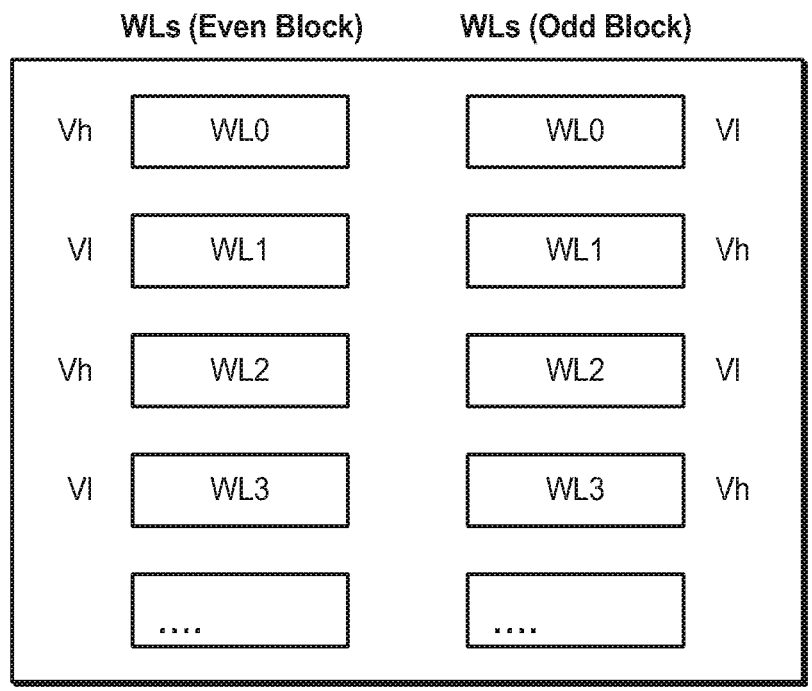

In an alternate stress mode, a stripe pattern can be applied, either as DC or toggled for a AC mode, to the word lines of adjacent blocks, where one pattern is applied for one block and the pattern reversed for the adjacent block. For example, on the word lines of even blocks, voltage levels can be applied in an alternating high-low pattern, as shown in FIG. 20, with the inverted low-high pattern on the odd blocks. This stress can again be done a pair of blocks at a time or multiple selected of blocks.

A post-stress detection sequence can then follow. The exemplary embodiment for a detection sequence uses an erase disturb test to detect the word line to word line shorts from adjacent blocks. This can be done by erasing all blocks of an array. For all blocks that pass the erase, a program follows to see whether blocks program correctly. For example, random data can be programmed on all blocks of the array, read back, and compared against the expected data to check for any program disturb. A block N can then be erased, after which an adjacent block N+1 is checked for any erase disturb.

Figure 21A:
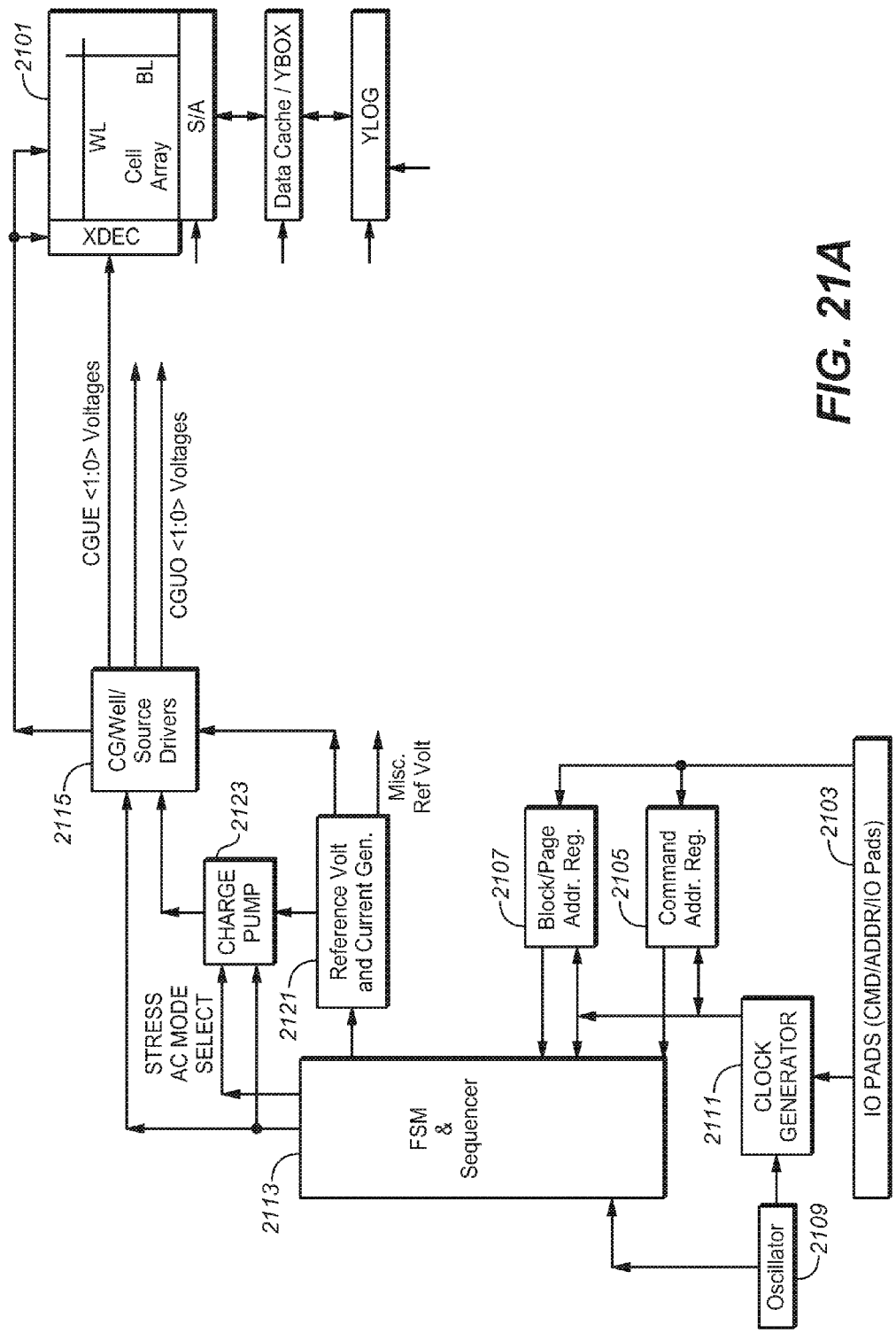
FIGS. 21A and 21B are a schematic representation of some of the elements on the memory chip involved in an inter-block word line short determination process.
Figure 21B:
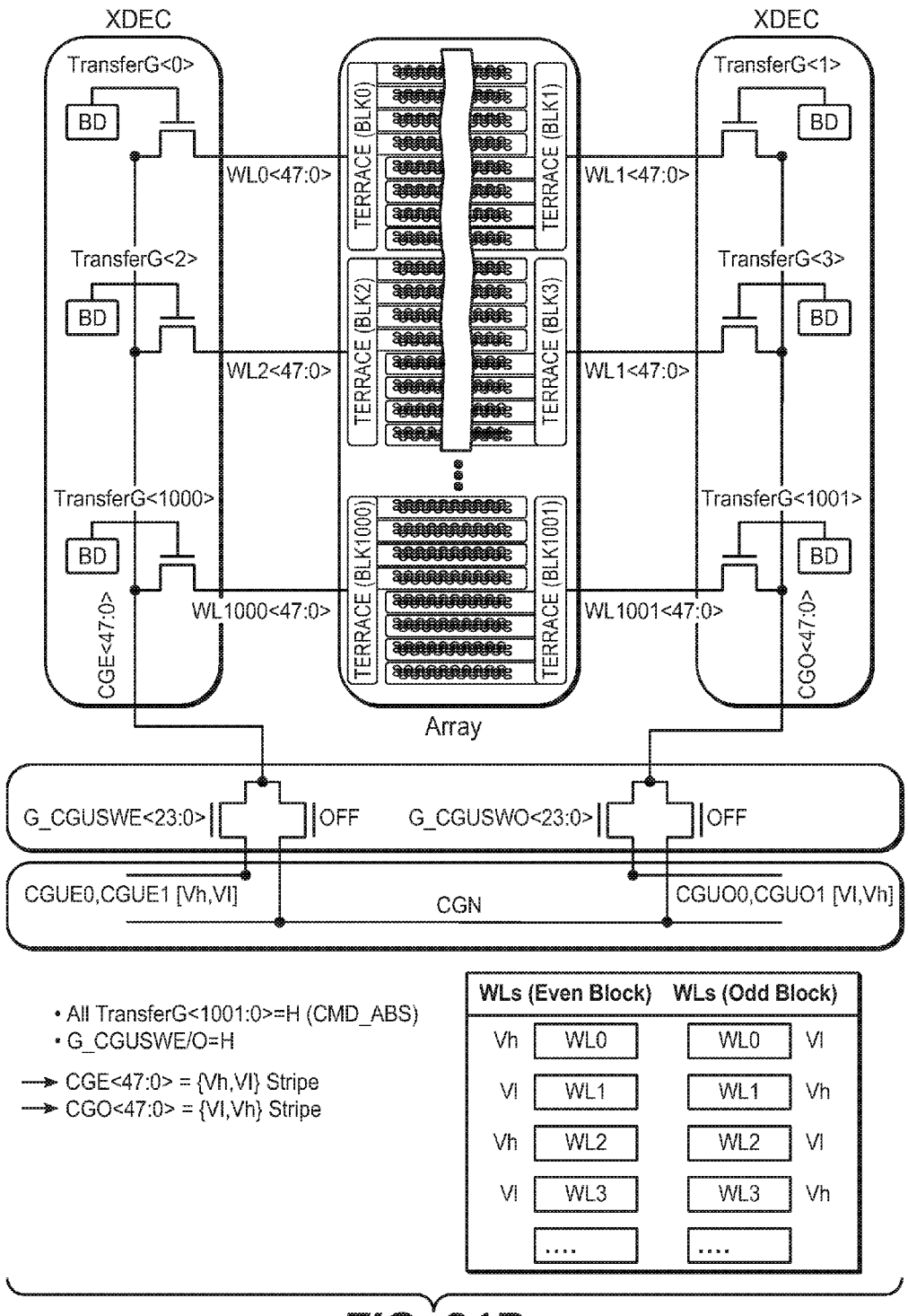

FIG. 21A is a schematic representation of some of the elements on the memory chip, similar to FIG. 17 and with the corresponding elements similarly numbered (i.e., array 1701 is now array 2101 and so on). To enable the inter-block word line to word line stress mode, a corresponding stress mode select signal is sent from the on-chip control logic to the charge pump, which in turn can supply the needed high voltage level to the control gate drivers in block 2115. These drivers can then supply the high and low stress voltages CGUE and CGUO to the even and odd blocks. FIG. 21B gives more detail on the decoding circuitry and its connections to the array for the exemplary embodiment, where the even block terraces are to the left and the odd block terraces to the right.

For any of the variations, the test mode of this section can consequently be used to catch word line to word line shorts between word lines of adjacent blocks. By using an AC version of the sort of alternating high and low voltage pattern illustrated with respect to FIG. 20, this can concurrently apply the sort stress described in the preceding section for word line to word line shorts within a block, helping to reduce test time.

For the voltage patterns of either of FIG. 19 or 20, the separate biasing of neighboring block is used, which is not conventional in NAND memory decoder designs, but which can be further enhanced for parallelism by using opposite alternating patterns on facing blocks. As with the other defect determination methods described here, the detection of adjacent blocks' erase disturb, program disturb, or both can help to avoid the corrupting of user data.

Select Gate Shorts

The preceding two sections looking at defects that could to shorts between word lines. Going back to the structure shown FIGS. 9 and 10, this has multiple select gates on both the source and drain sides, so that in each finger there will be oxide layers between the end most word lines and the adjacent select gates lines (on both the source and drain ends) and also between the multiple select gate lines themselves. There also will be oxide layers between the corresponding select gate layers in different, adjacent blocks and different adjacent finger. Also, as the select gates in the exemplary embodiment have tunable thresholds—that is, they are programmable—they also will be subjected to high voltage levels. Consequently, select gate to select gate and word line to select gate shorts can occur.

Figure 22:
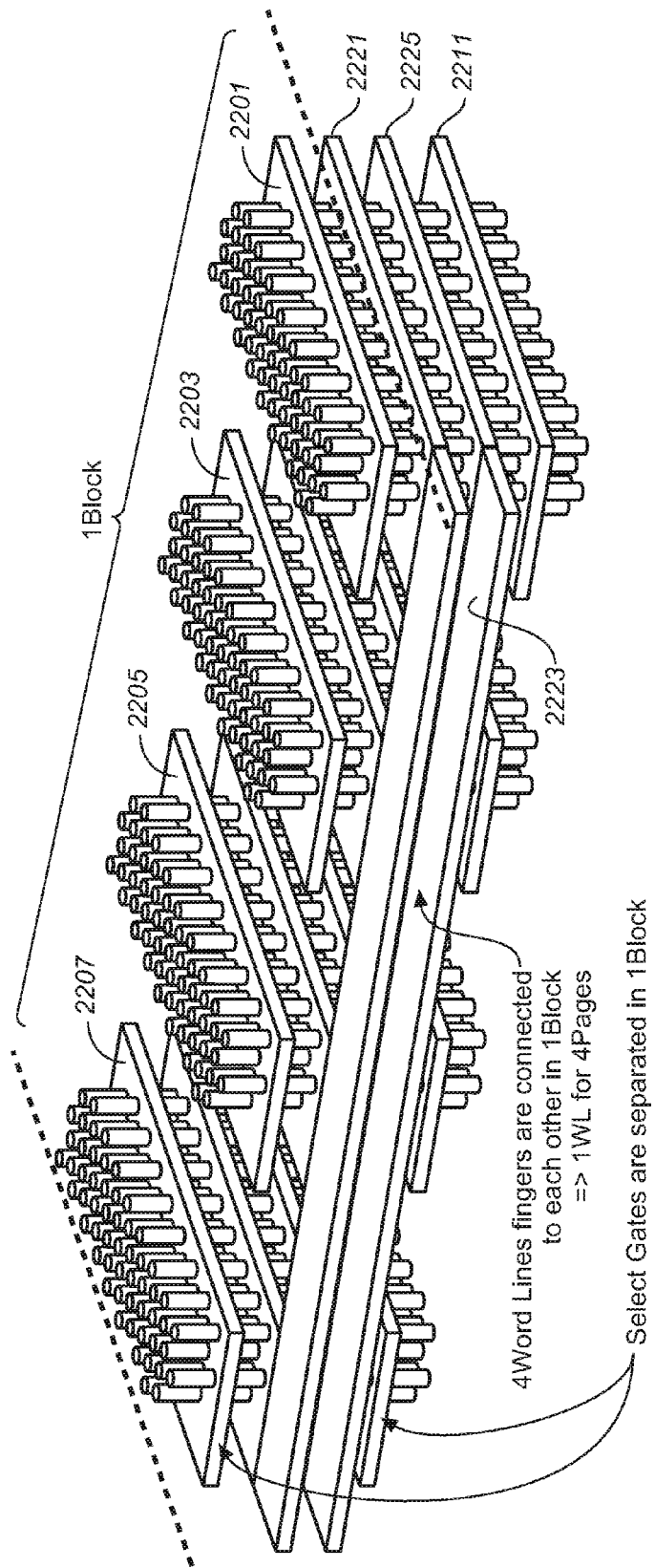
FIG. 22 is an oblique view of a simplified version of one block with four fingers, where each NAND string only has two memory cells and only a single select gate at either end.

Although similar to the word line case, the select gate structures have some differences that can be illustrated with respect to FIG. 22. FIG. 22 is an oblique view of a simplified version of one block with four fingers, where each NAND string only has two memory cells and only a single select gate at either end. Considering the rightmost finger, the pair of word lines 2221 and 2225 are between the select gate lines 2201 and 2211.

As discussed above, the word lines of a given level from different fingers of the same block are connected together, as shown at 2223 for word line 2221, along the terrace region. The select lines of the fingers, however, are separate, so that the fingers can individually be selected. Consequently, the select gate lines at 2201, 2203, 2205, and 2207 are independent controllable, lacking the sort of connection between fingers that 2223 effects for the word lines. The simplified drawing of FIG. 22 shows only a single select gate on either end, but when there are multiple select gates, these are typically operated in unison as they perform a common select function.

Figure 23:
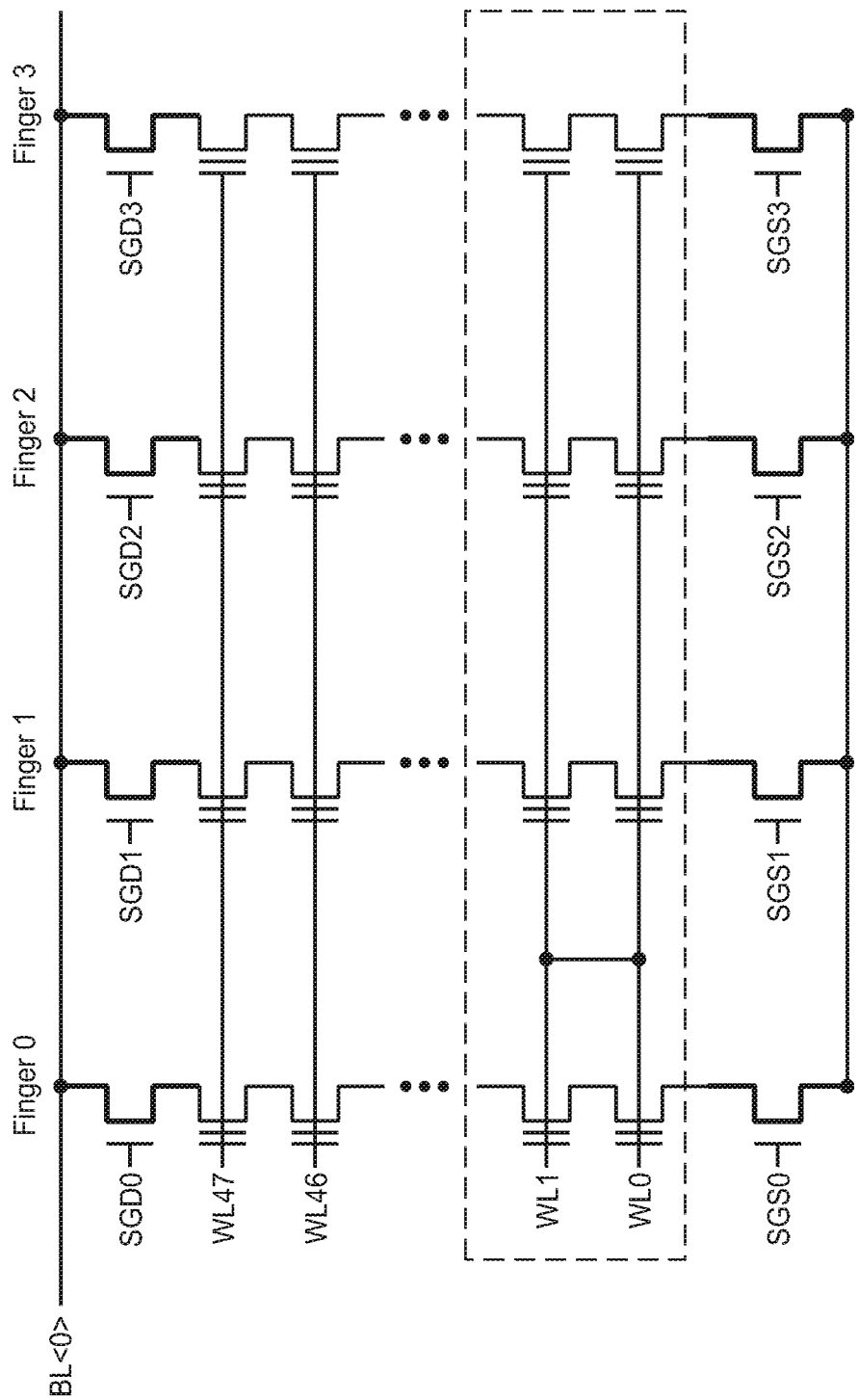
FIGS. 23 and 24 illustrate the consequences of a short between two word lines of the same block and a short between select gates.
Figure 24:
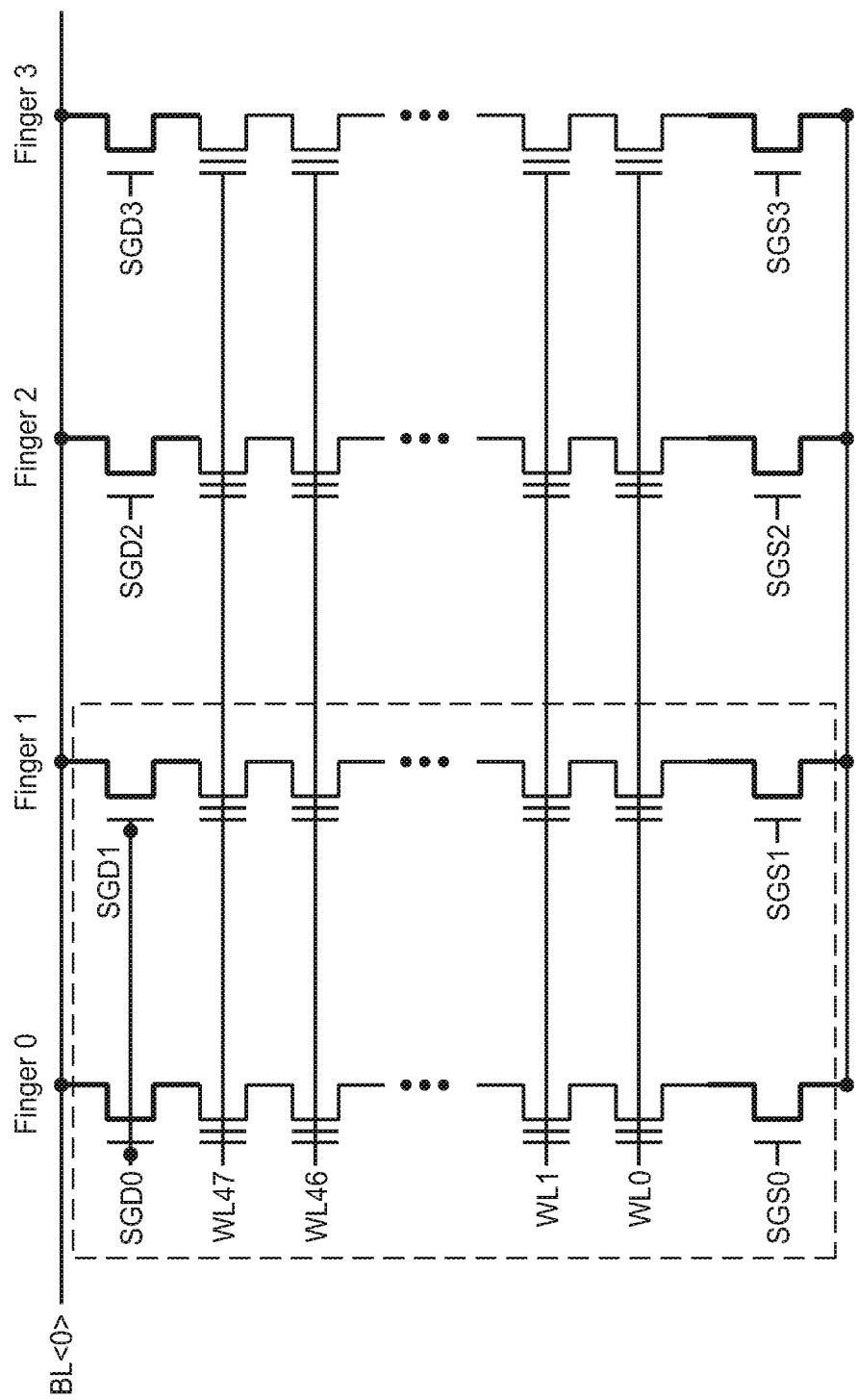

In this structure, the consequences of a select gate to select gate short can be more severe that a word line to word line short, as can be illustrated by comparing FIGS. 23 and 24. Both of these show four NAND strings from four different fingers of the same block. A given word line connects the gates across the fingers, while the select gates are individually controllable (where, in these figures, only a single select gate is shown on each of the source and drain sides).

Referring to FIG. 23, a short between two word lines (such as WL0 and WL1) would cause all of the pages of data on these word lines of the block to be lost. Referring now to FIG. 24, if instead there is a short between select gates of different finger (such as SGD0 and SGD1), the corresponding NAND strings cannot be independently accessed, causing the loss of a much larger number of pages. As with the word line case, there are several types of shorts to consider. There can be select gate to select gate shorts in the same finger of the same block; across different fingers of the same block; and between blocks. There also can be shorts between the end most word lines and adjacent select lines. A further possible short to the interconnect or local source line, affecting both word lines and select gate line, is discussed in the next section.

For each of these mechanism, a corresponding stress can be applied followed by a detection operation. Either an AC or DC stress can be used and can be done independently or, when appropriate, can be incorporated into the word line test operations. In some cases, such as the same block, different finger case, that is not available for the word line to word line case as illustrated in the FIG. 24, this would need to be an independent stress operation. Further, in addition to the stress and detection operations described herein, those presented in U.S. Patent Publication Nos.: 2012-0008405; 2012-0008384; 2012-0008410; 2012-0281479; 2013-0031429; 2013-0031429; and US2013-0229868 also can be adapted to the select gate, and select gate-word line, cases.

The biasing voltages for select gate-select gate stress can be different compares to word line case, both to reflect the different levels that are used on these different transistors and also on the different decoding options that may be available on the selects of the device. Although the drain and source select transistor sets are typically operated respectively as a single drain and source transistor, if some or all of the elements of each set of (in this example) four can be individually biased, if the needed select gate decoding is available, this can be used for applying a strip pattern, either AC or DC, between the select gates lines of the same finger, different fingers of the same block, adjacent fingers of different blocks, or some combination of these.

In the case where the set of select gates are share a gate contact (or, similarly, for only a single such gate), these will all have the same bias level and the stress is only applied between fingers (whether the same or different blocks). In an intermediate sort of situation where, say, one source select gate line ("SGSB") can be independently biased while the other three (SGS) are connected together to have the same control, several stress options are available, such as: SGSB-SGSB (adjacent fingers); SGS-SGSB shorts (same finger, as for a word line to word line short); and SGS (either of 3 SGS of one finger)-SGS (either of 3 SGS of adjacent finger).

Word Line to Local Source Line Shorts

In an array with a NAND type of architecture, the NAND string of a block are typically connected to a common source line, as shown at 34 of FIG. 5. The source lines of multiple blocks, even all of the blocks of a die, often share such a common source line. Referring to the 3D structure of FIG. 11, in the arrangement shown there, between each of the fingers of the same block a local common source line CELSRC (or local interconnect, LI) runs up to connect the source side of the NAND strings to one or more global common source lines (not shown in FIG. 11) running across the top the structure. As can be seen in FIG. 11, this places the word lines (and select gate lines) in proximity to this local source line interconnect, leading to the possibility of shorts across the intervening oxide.

During an erase operation in this sort of structure, the LI (CELSRC) will couple to the high erase voltage, while the word lines (and any dummy word lines) are low (0V) and the select gate lines can be either driven or floated to prevent them from being erased. In case of an LI to word line short, the erase voltage will be droop and the device may not be able to successfully erase the word lines. This defect also can cause read and program operations to fail. This is block level failure. This section looks at methods for determining such defects at test time.

In 2D NAND devices, there are often modes that apply a stress (high voltage) on word lines, while keeping the source line low (close to 0V), but this sort of stress mode can degrade the characteristics of the memory cells, leading reliability and endurance concerns. Additional, in a typically 2D arrangement, the metal line of a source line does not run next to word lines, so that the failure mode considered in this section is more specific structures, such as the BiCS array, that have this sort of lay out.

In the exemplary embodiment, a high voltage (~VH) is applied on the local common source line of the block (LI or CELSRC), and lower level is applied to the word lines, including any dummy word lines, with the select gate lines either driven or floated. Here VH is a voltage level such that VH is high enough to break weak oxide between LI and any word lines, but small enough such that reverse bias diode between the CPWELL (p+) and the CLESRC (n+) region does not break down; for example, in the exemplary embodiment this can be on the order an erase voltage, say 20V. The low level can be taken from among the low levels on the chip, such as VWL, VSG, or VL.

Both VWL and VSG are also voltage levels close to VSS or VSS, with values such that they will not stress the memory cells, so that endurance and reliability are not adversely affected. In this example, VSG is VSG voltage is mainly a biasing voltage to turn on the NAND string during read/program/erase operations and VWL can be mainly be VCGRV (control gate read-verify) level, where VCGRV voltage can go as low as close to 1V in an exemplary embodiment. The CPWELL level can be set at range of values between the high and low levels, as long as combinations with the other voltages does not break down the reverse bias diode between the CPWELL (p+) and the CLESRC (n+) region.

This arrangement of bias levels will stress weak oxide depositions, whether due to contamination or other defect, in the region between the word lines and the local source line interconnect to bring about a short. This can cause the defect to manifest itself at test time, rather than once the device is in use. As high voltage levels are not placed on the word lines, the cells will not be stressed, avoiding adverse effects for reliability and endurance. FIG. 25 again shows a side view of the exemplary embodiment with an overview of the applied voltages.

Figure 25:
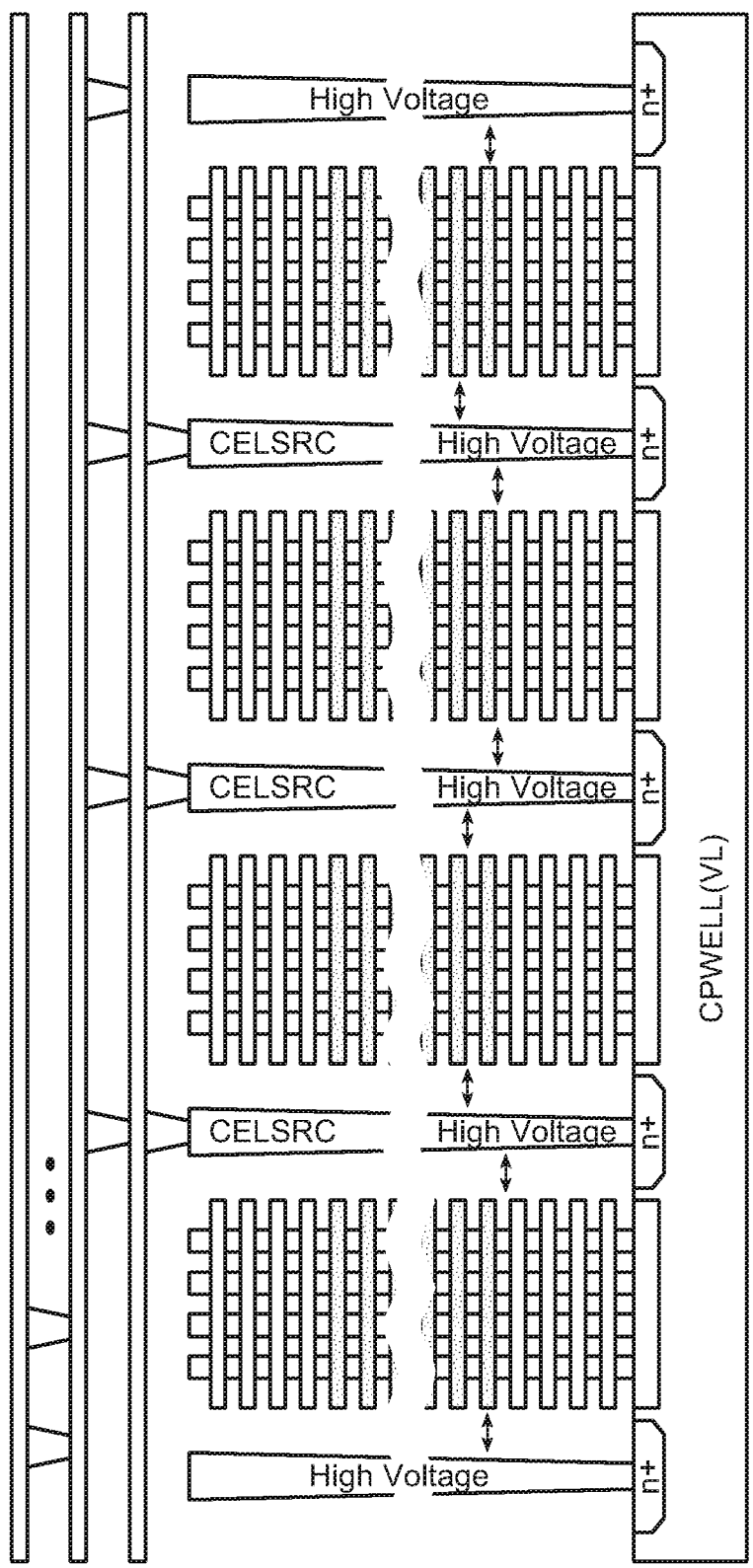
FIG. 25 shows a side view of the exemplary embodiment with an overview of the applied voltages to stress for local interconnect to word line physical shorts.

In FIG. 25 the word line to local source line stress is applied in the circled region. The low voltage levels on the leftmost finger and the high voltage on the vertical source line interconnect. The arrows illustrate particular examples of locations of stress between a word line and the source interconnect line where leakage could occur.

Figure 26:
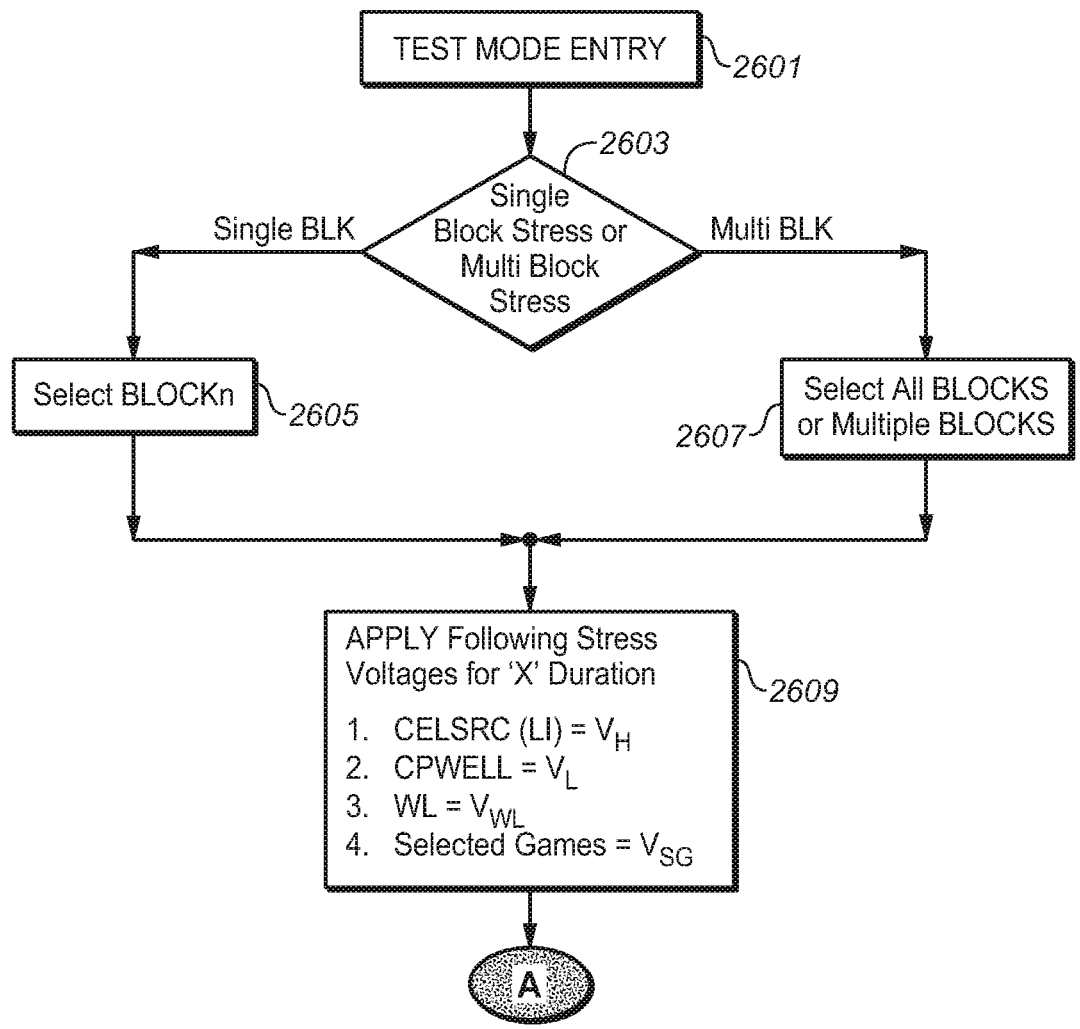
FIGS. 26 and 27 are an exemplary flow of a test mode to screen local interconnect to word line physical shorts.
Figure 27:
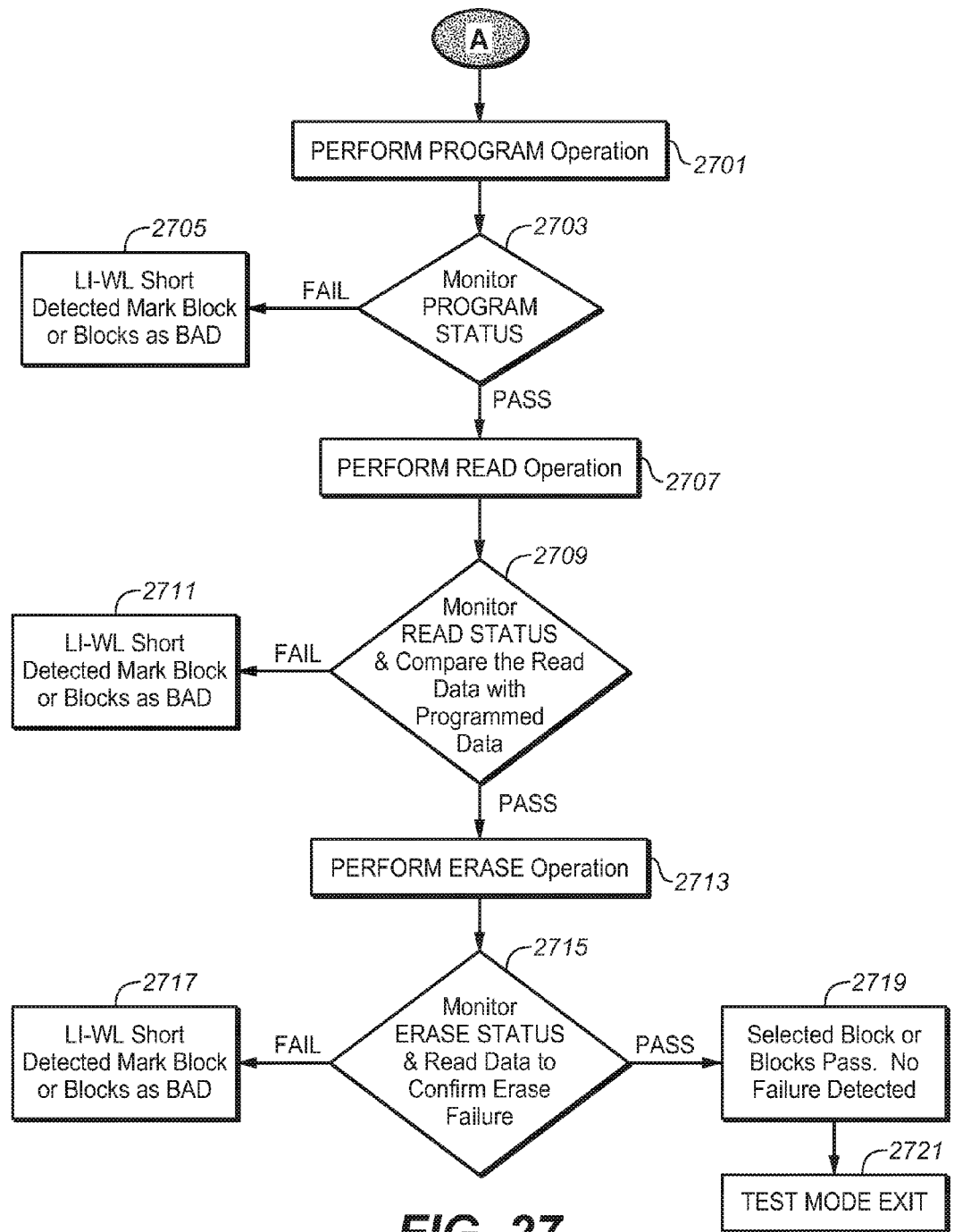

FIGS. 26 and 27 are an exemplary flow of a test mode to screen local interconnect (LI) to word line physical shorts, similar to FIGS. 15 and 16 above for the intra-block word line to word line case. The test mode can either be done as part of an initial test process or as a system level countermeasure where, after some number of cycles and before erasing any blocks, the test can be done to catch any bad blocks before programming in any data.

FIG. 26 is the stress phase and starts at 2601 with entry into the text mode. At 2603 the determination is made as to whether a single block or multiple blocks are to be tested and at 2605 or 2607 the corresponding select signals are sent out. The stress voltages are then applied at 2609. As with the word line to word line cases, the duration of the stress is a settable parameter, as can be the various levels.

FIG. 27 illustrates an exemplary embodiment for the detection phase, where many of the specifics are as discussed with respect to FIG. 16. This begins with a program operation at 2701, which is monitored at 2703. If the program fails for any blocks, these are marked bad (2705). If the program operation passes, a read can then be performed at 2707. The read status is then monitored at 2709 and the result can be checked by, for example, comparing the data as read back with the data as stored. Any blocks that fail are marked bad at 2711. If the read operation passes, an erase can then be performed at 2713. This is monitored at 2715, with any failing blocked marked at 2717. If the erase is passed (2719), the test mode is then exited (2721).

Figure 28:
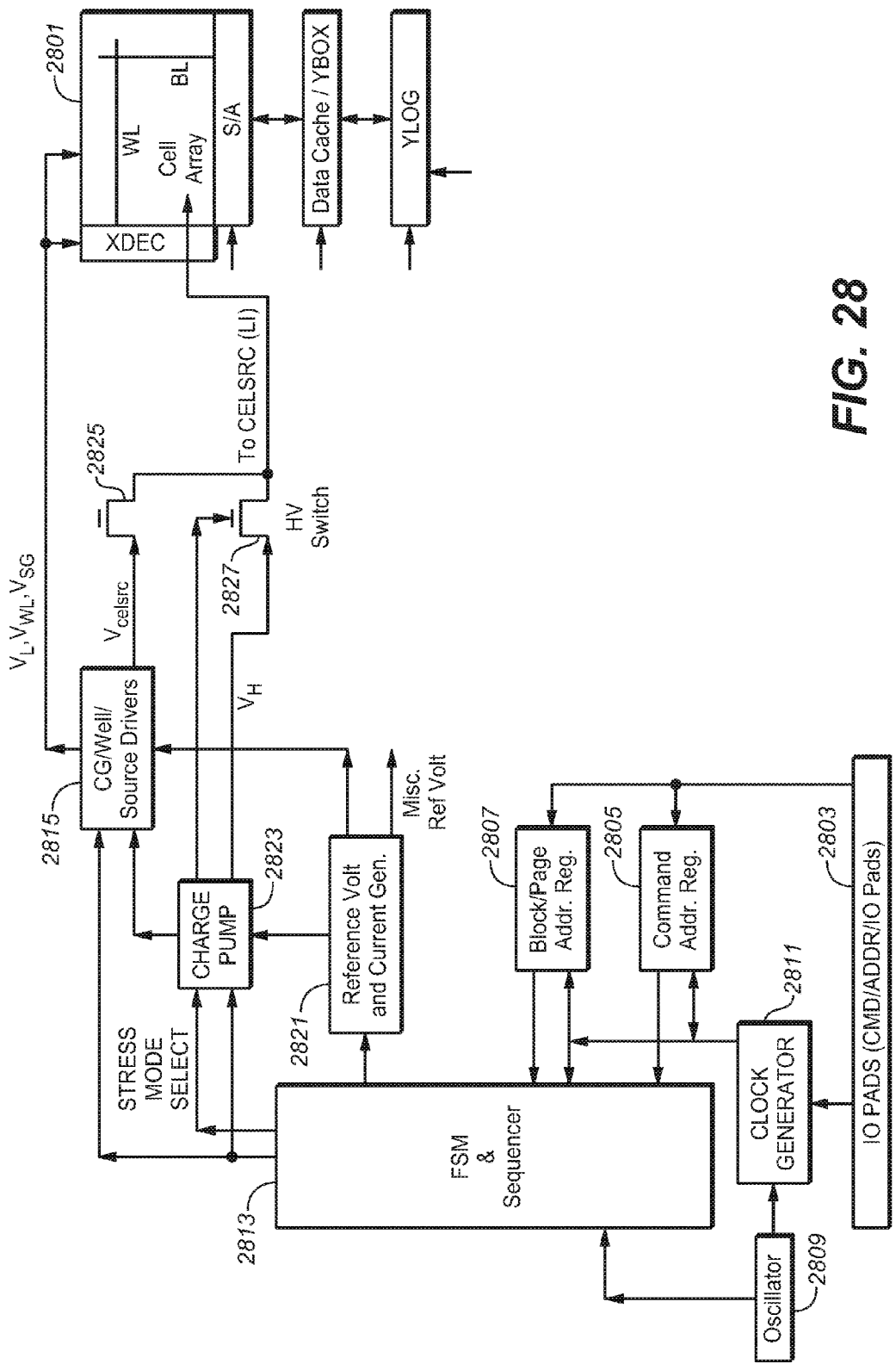
FIG. 28 is a schematic representation of some of the elements on the memory chip that are involved in the process of FIGS. 26 and 27.

FIG. 28 is a schematic representation of some of the elements on the memory chip, similar to FIGS. 17 and 21, and with the corresponding elements similarly numbered. To enable the inter-block word line to word line stress mode, a corresponding stress mode select signal is sent from the on-chip control logic to the charge pump, which in turn can supply the needed voltage levels for the word lines and select gate lines to the drivers in block 2115. The usual levels for CELSRC are supplied through switch 2825, with high voltage VH from the charge pump can be supplied through a high voltage switch 2827, that also can get its control gate voltage from the charge pump.

Bit Line to Low Voltage Signal Shorts

In the memory array, global bit lines span the structure connecting the memory cells to the sense amplifies used in sensing operations. This shown above in FIG. 18, for instance, where each NAND string is connected to a bit line, and each bit line is connected to a NAND string in finger. The sense amps are then located on the periphery of the array. In the exemplary embodiment, and for simplifying this discussion, each sense amp connects to a single bit line.

In other embodiments, where less than all of the bit lines are sensed at once (say, every other or every fourth bit line being sensed concurrently), multiple bit lines (such as 2 or 4) are associated with each sense amp. As the spacing of bit lines is typically smaller than the area needed by the sense amp circuits, the sense amp circuits are often staggered relative to one another in the chip's layout. This means that one bit line may be adjacent to the sense amp associated with another bit line.

During erase operations in some memory circuit designs, such as the exemplary BiCS type embodiment illustrated with respect to FIGS. 9-12, during an erase operation bit lines will couple to the erase voltage (which can be in the ~20-24V range), taking the bit lines to a high voltage. The sense amplifiers generally operate at lower voltages, such as VSS (0V), the high logic level (VDD, in the ~2-3V ranges), and, in some embodiments, a somewhat higher sense amp level used in pre-charging bit lines for sensing operations (VDDSA, in the ~4-5V range). More detail on sense amp structures and the levels involved is given in U.S. Patent Publication No. 2014-0003157.

Due to the proximity of the bit lines at high voltages with sense amp circuitry at relatively low voltages, the bit lines can short to the adjacent lower voltage circuitry. In case of such a bit line to low voltage signal short during device operations, the erase voltage (VERA) may droop and circuit will not be able to successfully erase selected blocks. Even if the bit line is repaired, this fault can still cause erase failure. Further, as the bit lines are global, this will be global defect for the portion of the array (typically the entire plane) spanned by the defective bit line.

Figure 29:
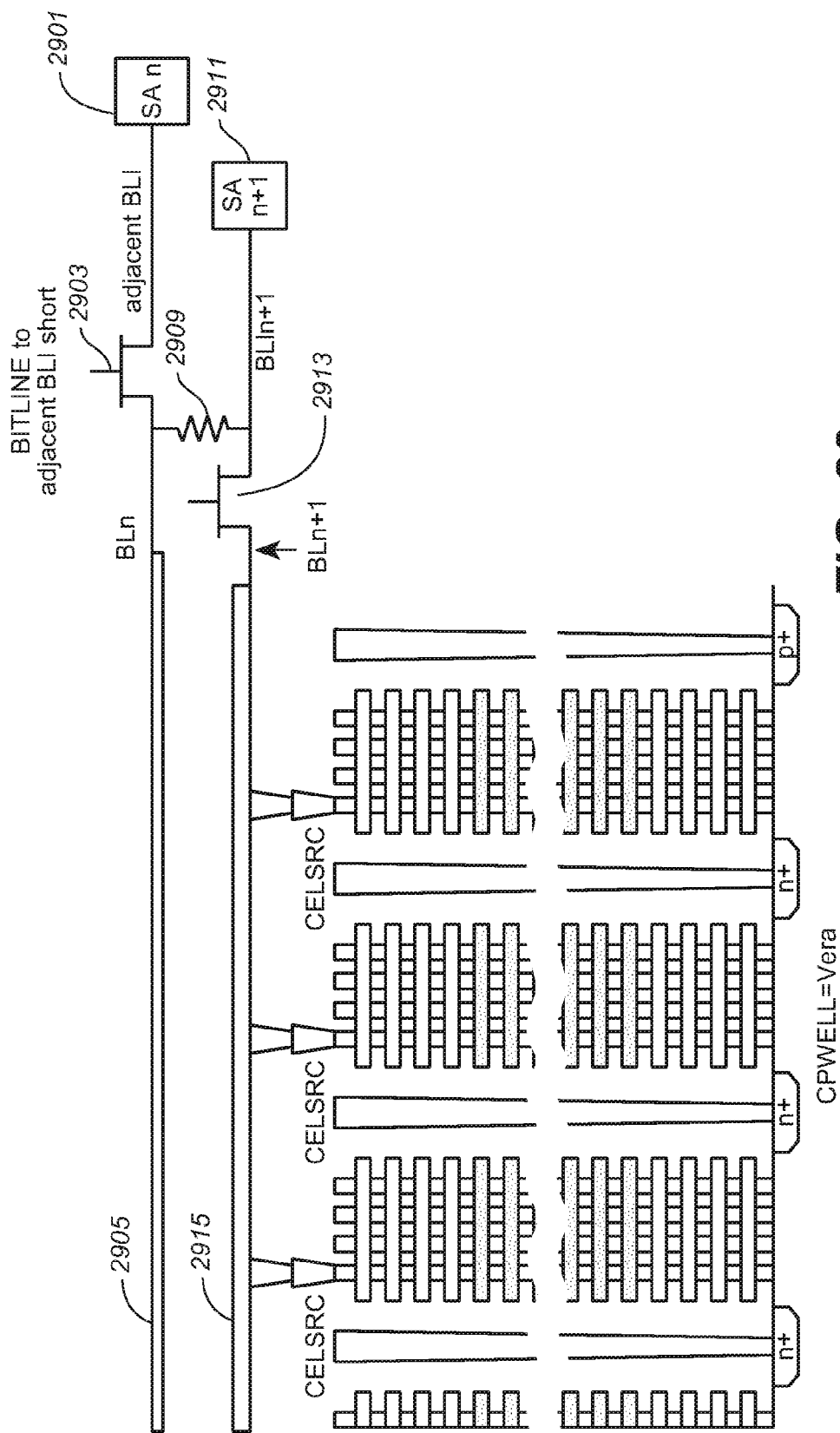
FIG. 29 is a schematic representation of a possible bit line to low voltage short.

FIG. 29 is a schematic representation of the situation in the BiCS context. A side view of several fingers of the array are shown, a pair of adjacent bit lines BLn 2905 and BLn+1 be explicitly shown at top. In an erase operation, the CPWELL is biased to the high erase voltage Vera. The unselected NAND strings will transmit the high voltage to these bit lines. Each of bit lines BLn 2905 and BLn+1 2915 are respectively connected an associated sense amp SAn 2901 and SAn+1 2911 though a switch 2903 and 2913, where sense amps are connect to the switches by an "internal" part of the bit line BLIn, BLIn+1.

During erase, the switches 2903, 2913 are shut off, protecting the sense amps' circuitry and keeping the high voltage contained. Due to the layout, however, one bit line (such as BLn) may be adjacent to the BLI portion, or other sense amp elements, associated with another bit line (such as BLn+1), resulting in a short as represented at 2909. Consequently, for any erase operation the high voltage Vera on the CPWELL will drain off through bit line BLn 2905. If the charge pump supplying the erase voltage in not able to keep up with this leakage, Vera will not be maintained and the erase operation will fail.

Although illustrated for a 3D arrangement, this problem also can show up in other architectures, including in 2D arrays. As in the preceding sections, to detect such defects, a test can mimic the stress involved to force incipient failures and then perform a detection phase to see whether the circuit is able to perform the needed operations.

In the stress operation, one or more bit lines are set to the high voltages, while one or more adjacent internal bit lines (BLI) and/or associated sense amp circuits are set to a lower sense amp voltage. Although this can be done by applying the high level directly to the bit lines, most memory circuits typically do not include such connections. Consequently, the exemplary embodiment establishes the high bit line voltage as these would come about through normal circuit operations, namely from the CPWELL.

This can be done in a 1-plane erase failure stress mode by applying the high voltage to the P-well (e.g., bias ~20-24V) and having all blocks unselected, so the bit lines will couple through the NAND strings to the high voltage, while concurrently setting the sense amp nodes to the (relatively) low sense amp voltages (VDDSA/VDDNSS). The stress can be applied in either a DC mode for some duration, or in an AC by applying some number of pulses of given durations to the P-well.

Any resultant bit line short would drain off the high voltage from the P-well, reducing its ability to effect an erase as the charge pump supplying the high voltage may not be able to keep up. This is used in the detection operation of the exemplary flow by reducing the drive capability of the charge pump and determining whether the erase voltage can be held.

For example, the pump clock can be set at the slower end of its range and the Vera voltage being measure internally to detect any droop due to a bit line high voltage-sense amp node low voltage defect/leak. A comparator circuit can use a reference voltage for compassion with the Vera level. Alternately, the pump clock can be set at its slowest and an auto-detect built in self-test (BIST) mode can be based on the charge pump's ON time being, due to the leakage, longer than typical. (More detail on charge pump systems is given in application Ser. No. 14/101,180 filed on Dec. 9, 2013, and a large number of references cited therein.)

Figure 30:
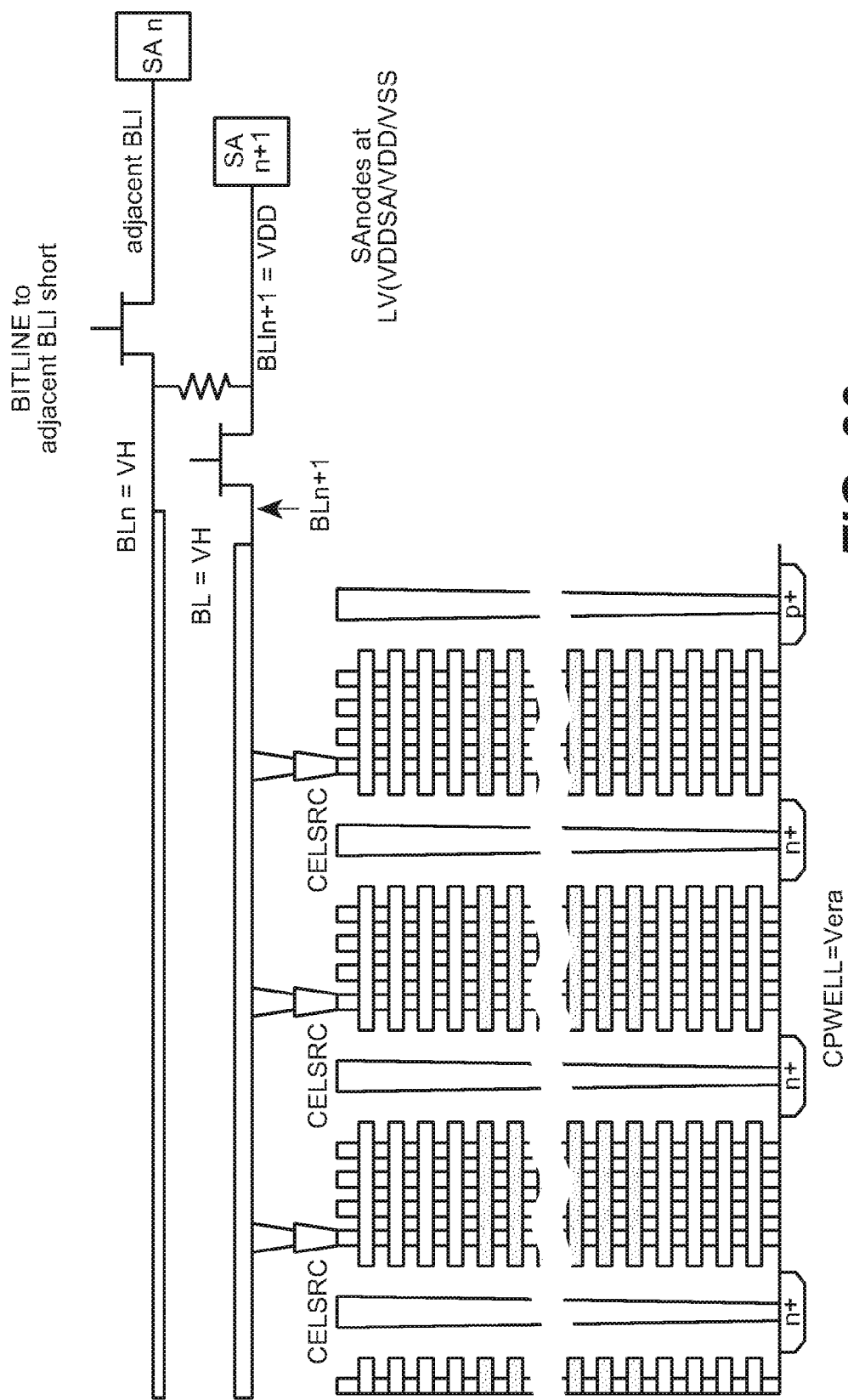
FIG. 30 is similar to FIG. 29, but marked with some of the voltage levels involved in the stress phase of determining bit line shorts.

This technique will stress the bit line to low voltage node, accelerating the failure of defects, but without overly stress the memory cells of the array. FIG. 30 is similar to FIG. 29, but marked with some of the voltage levels involved in the stress phase. As discussed above, VH is a voltage level high enough to break weak oxide between the bit lines and the low voltage nodes, but small enough such that there no degradation of the select gates or any other circuit elements. LV is the relatively low voltages used by the sense amp nodes (e.g., VDDSA/VDDNSS).

In the exemplary embodiment, the blocks are all unselected, with the NAND strings conducting between the P-well and bit lines. This stress mode is chosen to minimize effects on cell characteristics to avoid negative effects on reliability and endurance. The stress mode also can be used at system level by applying the bit line to low voltage node stress to catch full plane erase issues prior to programming data into the array. The stress can be applied at time 0 or after some numbers of program-erase cycles.

Figure 31:
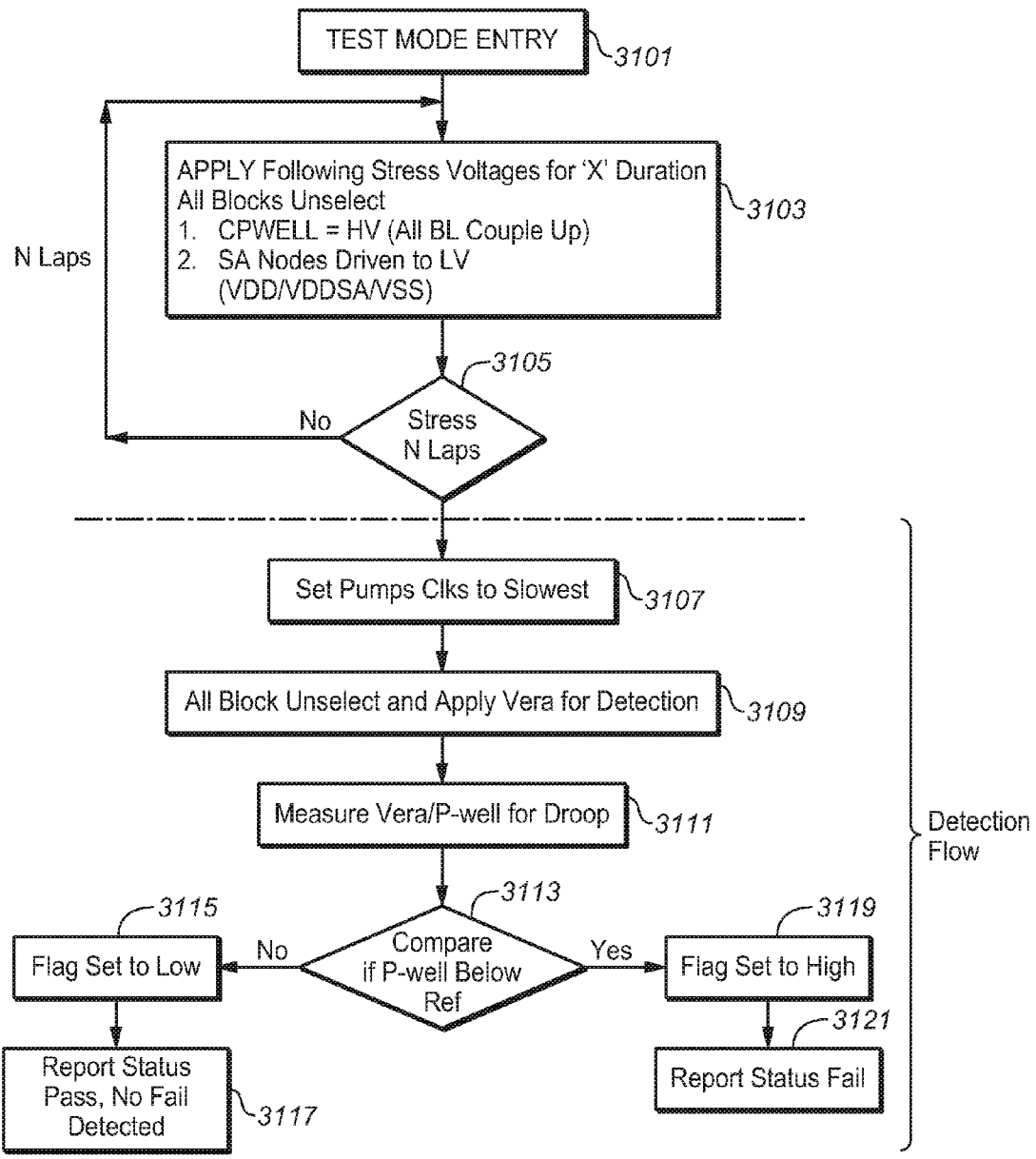
FIG. 31 is an exemplary flow for test process for determining bit line to low voltage shorts.

FIG. 31 is an exemplary flow for these test processes, beginning by entering the test mode at 3101. The stress is applied at 3103, where the duration and voltage levels can be settable parameters. If an AC stress mode is used, this will applied for N loops 3105, where N also can be a settable parameter. In the exemplary detection flow, the pump clock is set to its slowest (3107), all of the blocks in the plane are unselected and the Vera is supplied to the P-well from the pump (3109), and value of Vera on the P-well is measured (3111). At 3113 the P-well level is compared against a reference level and if the P-well level has drooped, a flag can be set according (here, as high at 3119) and this status can be reported out at 3121. If Vera is maintained, the flag is set (in this example) as low at 3115 and the status reported out at 3117.

Figure 32:
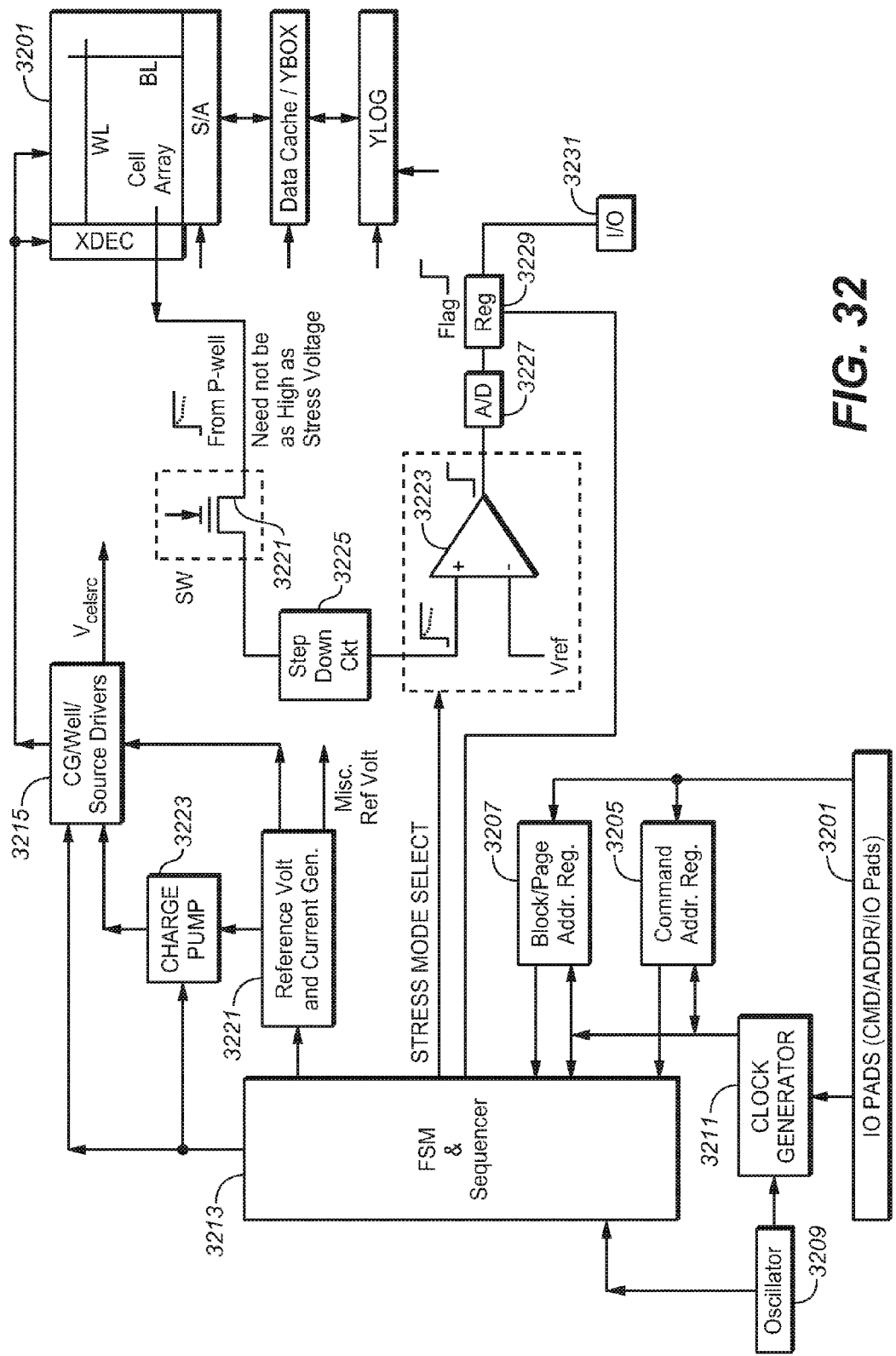
FIG. 32 is a schematic representation of some of the elements on the memory chip involved in the process of FIG. 31B.

FIG. 32 is a schematic representation of some of the elements on the memory chip, similar to (and similarly number to) FIGS. 17, 21 and 28, for implemented the test mode of FIG. 31. During the detection phase as enabled by the stress mode select signal, while the detuned charge pump drives the P-well the switch SW 3221 supplies the P-well level to the comparator 3223. This can be stepped down by the step down circuit 3225 for comparison to a reference level Vref.

The output of the comparator 3223 can then be converted to a digital value at A/D 3227 and stored in the register 3229 as the Flag value, where the register 3229 can receive a clock signal from the FSM & Sequencer block 3213 to latch the flag value. The flag value will indicate if the plane failed, and put out at the I/O page 3231 (separated out here form the other pads for illustrative purposes).

Conclusion

The foregoing detailed description of the invention has been presented for purposes of illustration and description, and is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. The claims appended hereto define the scope of the invention.

The invention claimed is:

1. A method comprising:
performing a select gate to select gate stress operation on a first select gate line and a second select gate line of a non-volatile memory circuit comprising a memory array that includes a plurality of memory cells coupled in series between one or more drain select gates and one or more source select gates, the first select gate line coupled to a first one of the one or more drain select gates and the one or more source select gates, and the second select gate line coupled to a second one of the one or more drain select gates and the one or more source select gates, the select gate to select gate stress operation including applying a set of stress voltage levels to the first and second select gate lines to thereby introduce a voltage differential therebetween; and
subsequently performing a defect determination operation on the first and second select gate lines to determine leakage therebetween.

2. The method of claim 1, wherein the first and second select gate lines are coupled to corresponding source select gates.

3. The method of claim 1, wherein the first and second select gate lines are coupled to corresponding drain select gates.

4. The method of claim 1, wherein the set of stress voltage levels comprise a DC stress.

5. The method of claim 1, wherein the set of stress voltage levels comprise an AC stress.

6. The method of claim 1, wherein the first and second select gate lines comprise a common set of NAND strings.

7. The method of claim 1, wherein the memory array comprises a plurality of blocks and the first and second select gate lines comprise differing adjacent blocks.

8. The method of claim 1, wherein the memory array comprises a plurality of blocks each having a plurality of independently selectable sub-blocks, and the first and second select gate lines comprise differing adjacent sub-blocks of the same block.

9. The method of claim 1, wherein the first one of the one or more drain select gates and the one or more source select gates, and the second one of the one or more drain select gates and the one or more source select gates each have programmable threshold levels, and wherein the defect determination operation comprises:

performing a programming operation on the first one of the one or more drain select gates and the one or more source select gates, and the second one of the one or more drain select gates and the one or more source select gates; and determining whether the programming operation was successful.

10. The method of claim 1, wherein:

the memory circuit comprises a monolithic three-dimensional semiconductor memory device where the memory cells are arranged in multiple physical levels above a silicon substrate and comprise a charge storage medium; and the memory array comprises NAND strings that run in a vertical direction relative to the substrate.

11. A method comprising:

performing a word line to select gate stress operation on a word line and a select gate line of a non-volatile memory circuit comprising a memory array that includes a plurality of memory cells coupled in series between a drain select gate and a source select gate, the word line coupled to one of the memory cells, the select gate line coupled to the drain select gate or the source select gate, the word line to select gate stress operation including applying a set of stress voltage levels to the word line and select gate line to introduce a voltage differential therebetween; and subsequently performing a defect determination operation on the word line and select gate line to determine leakage therebetween.

12. The method of claim 11, wherein the select gate line is coupled to the source select gate.

13. The method of claim 11, wherein the select gate line is coupled to the drain select gate.

14. The method of claim 11, wherein the set of stress voltage levels comprise a DC stress.

15. The method of claim 11, wherein the set of stress voltage levels comprise an AC stress.

16. The method of claim 11, wherein the memory circuit is a monolithic three-dimensional semiconductor memory device where the memory cells are arranged in multiple physical levels above a silicon substrate and comprise a charge storage medium, and wherein the memory array comprises a NAND type architecture in which NAND strings run in a vertical direction relative to the silicon substrate.

* * * * *